US012635493B2

(12) United States Patent
Tsai et al.

(10) Patent No.: US 12,635,493 B2
(45) Date of Patent: May 19, 2026

(54) ALL-TUNGSTEN SCHEME FOR SOURCE/DRAIN CONTACT, SOURCE/DRAIN VIA, AND GATE VIA

(71) Applicant: Taiwan Semiconductor Manufacturing Company, Ltd., Hsin-Chu (TW)

(72) Inventors: Chen-Hung Tsai, Kaohsiung (TW); Pang-Chi Wu, Hsinchu (TW); Fu-Kai Yang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 371 days.

(21) Appl. No.: 18/324,295

(22) Filed: May 26, 2023

(65) Prior Publication Data

US 2024/0395618 A1     Nov. 28, 2024

(51) Int. Cl.
*H01L 21/768* (2006.01)
*H01L 21/285* (2006.01)
(Continued)

(52) U.S. Cl.
CPC .... *H10W 20/0698* (2026.01); *H10D 64/0112* (2026.01); *H10W 20/033* (2026.01);
(Continued)

(58) Field of Classification Search
CPC ......... H01L 21/76802; H01L 21/76804; H01L 21/76807; H01L 21/7684; H01L 23/535;
(Continued)

(56) References Cited

U.S. PATENT DOCUMENTS 8,772,109 B2     7/2014   Colinge
8,785,285 B2     7/2014   Tsai et al.
(Continued)

OTHER PUBLICATIONS

Liang et al., "Method and Device Related to Seamless Metal Contact," U.S. Appl. No. 18/182,921, filed Mar. 13, 2023, Assignee: Taiwan Semiconductor Manufacturing Company, Ltd., 34 pages specification, 49 pages drawings.
(Continued)

*Primary Examiner* — William B Partridge
(74) *Attorney, Agent, or Firm* — HAYNES AND BOONE, LLP

(57) ABSTRACT

The present disclosure provides a method for semiconductor fabrication. The method includes receiving a workpiece having gate structures over channel regions on a substrate and source/drain (S/D) features adjacent to the channel regions. The method then forms tungsten S/D contacts over the S/D features in a first ILD layer by a first selective bottom-up metal growth process. The method forms tungsten S/D vias over the tungsten S/D contacts in a second ILD layer by a second selective bottom-up metal growth process. And after forming the tungsten S/D vias, the method forms tungsten gate vias over the gate structures in the first and the second ILD layer. The forming of the tungsten gate vias includes forming a tungsten seed layer by physical vapor deposition (PVD), and depositing tungsten directly on horizontal and sidewall surfaces of the tungsten seed layer by chemical vapor deposition (CVD).

20 Claims, 22 Drawing Sheets

(51) Int. Cl.

| | |
|---|---|
| *H10D 64/01* | (2025.01) |
| *H10W 20/00* | (2026.01) |
| *H10W 20/20* | (2026.01) |
| *H10W 20/41* | (2026.01) |

(52) U.S. Cl.
CPC ....... *H10W 20/045* (2026.01); *H10W 20/062* (2026.01); *H10W 20/20* (2026.01); *H10W 20/425* (2026.01)

(58) Field of Classification Search
CPC ......... H01L 21/76843; H01L 21/76844; H01L 21/76846; H01L 21/76871; H01L 23/53266; H01L 21/76876; H01L 21/76877; H01L 21/76879; H01L 21/76865
See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 10,269,621 | B2 | 4/2019 | Wang et al. |
| 2019/0148226 | A1* | 5/2019 | Yim .................. H01L 21/76876 257/383 |
| 2022/0359399 | A1 | 11/2022 | Lin et al. |

OTHER PUBLICATIONS

Xiao, Hong, "Introduction to Semiconductor Manufacturing Technology," 2012, p. 610, 2nd ed., Society of Photo-Optical Instrumentation Engineers (SPIE), Bellingham, WA, USA.

\* cited by examiner

100

Receive a workpiece having gate structures over channel regions on a substrate and source/drain (S/D) features adjacent to the channel regions — 102

Deposit a first interlayer dielectric (ILD) layer over the gate structures and over the S/D features — 104

Form S/D trenches through the first ILD layer, the S/D trenches exposing top surfaces of the S/D features — 106

Form silicide features on the S/D features — 108

Form a first tungsten seed layer by physical vapor deposition (PVD) over the silicide features — 110

Remove top portions of the first tungsten seed layer by a first removal process — 112

Remove side portions of the first tungsten seed layer by a second removal process — 114

Form tungsten S/D contacts by growing tungsten over remaining portions of the first tungsten seed layer by selective bottom-up metal growth — 116

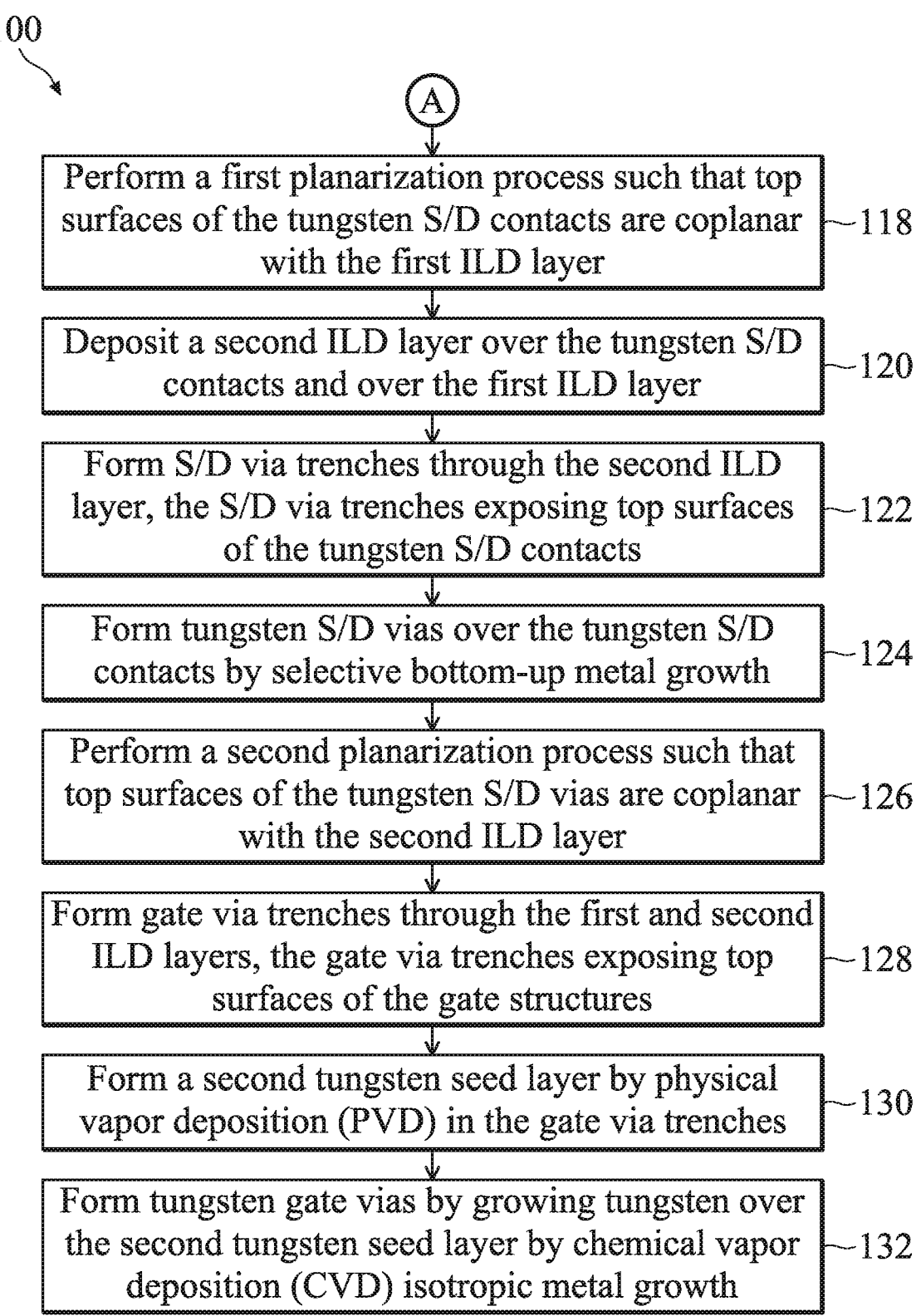

(A)

Perform a first planarization process such that top surfaces of the tungsten S/D contacts are coplanar with the first ILD layer ~118

Deposit a second ILD layer over the tungsten S/D contacts and over the first ILD layer ~120

Form S/D via trenches through the second ILD layer, the S/D via trenches exposing top surfaces of the tungsten S/D contacts ~122

Form tungsten S/D vias over the tungsten S/D contacts by selective bottom-up metal growth ~124

Perform a second planarization process such that top surfaces of the tungsten S/D vias are coplanar with the second ILD layer ~126

Form gate via trenches through the first and second ILD layers, the gate via trenches exposing top surfaces of the gate structures ~128

Form a second tungsten seed layer by physical vapor deposition (PVD) in the gate via trenches ~130

Form tungsten gate vias by growing tungsten over the second tungsten seed layer by chemical vapor deposition (CVD) isotropic metal growth ~132

200
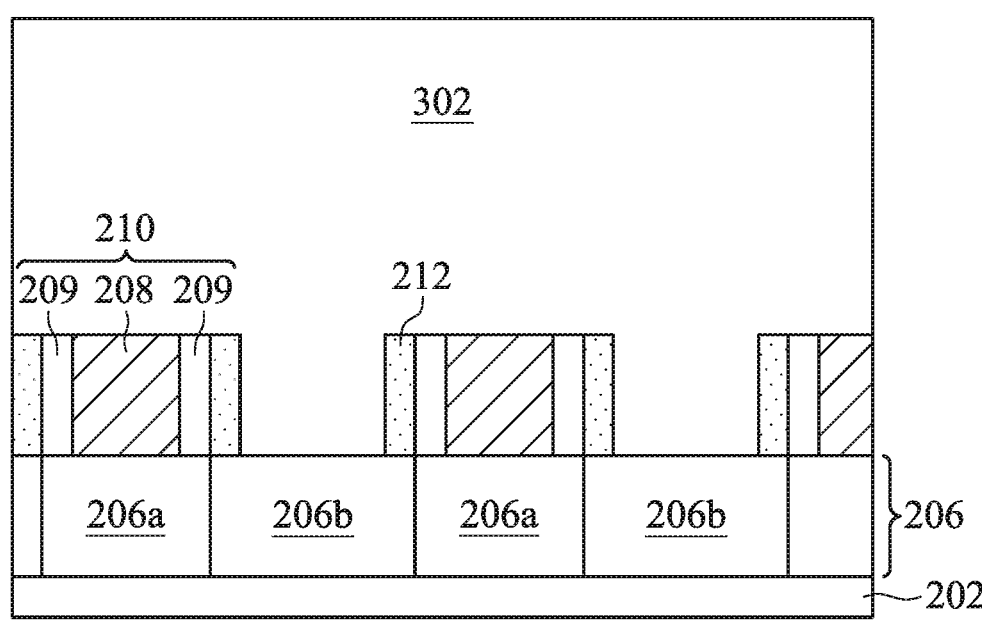
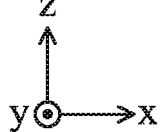
Fig. 3

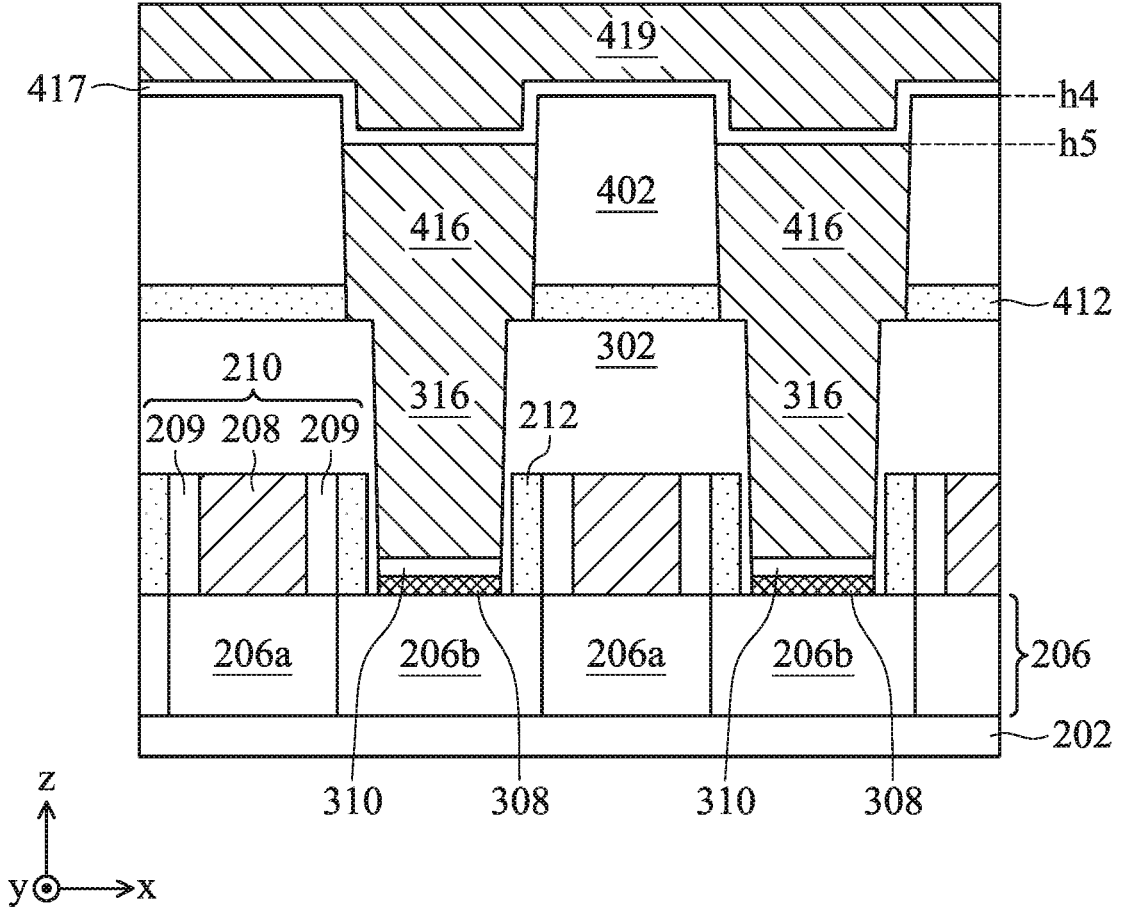
Fig. 15

ALL-TUNGSTEN SCHEME FOR SOURCE/DRAIN CONTACT, SOURCE/DRAIN VIA, AND GATE VIA

BACKGROUND

The integrated circuit (IC) industry has experienced exponential growth. Technological advances in semiconductor manufacturing have produced generations of ICs, where each generation has smaller and more complex circuits than the previous generation. In the course of IC evolution, functional density (i.e., the number of interconnected IC devices per chip area) has generally increased while geometry size (i.e., dimensions and/or sizes of IC features and/or spacings between these IC features) has decreased. Typically, scaling down has been limited only by an ability to lithographically define IC features at the ever-decreasing geometry sizes.

However, as feature sizes continue to decrease, metal contacts and/or vias need to fit into smaller spaces while minimizing contact resistance. Fitting metal material into smaller spaces often produce seams or voids, thereby degrading electrical connection. The undesired seams may be formed when forming source/drain contacts and source/drain vias, which then connect to upper level interconnects and metal lines. The same issues may be true when forming gate vias on top of metal gates. To avoid the voids and to minimize contact resistance, existing methods to form low resistance metal contacts and/or vias are costly (e.g., requiring expensive wet clean chemical, process sequence tightening, and interface engineering). As such, there is a need to optimize and balance between performance and cost; to achieve low resistance in the metal fill schemes while still simplifying the manufacturing process.

Therefore, although existing methods of forming semiconductor metal contacts and vias have been generally adequate for their intended purposes, they have not been entirely satisfactory in every aspect.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

FIGS. 1A-1B illustrate a flow chart of a method for fabricating metal contacts and vias, in portion or entirety, according to various aspects of the present disclosure.

FIGS. 2-20 illustrate cross-sectional views of a semiconductor device at intermediate stages of fabrication and processed in accordance with the method of FIGS. 1A-1B according to an embodiment of the present disclosure.

DETAILED DESCRIPTION

Figure 2:
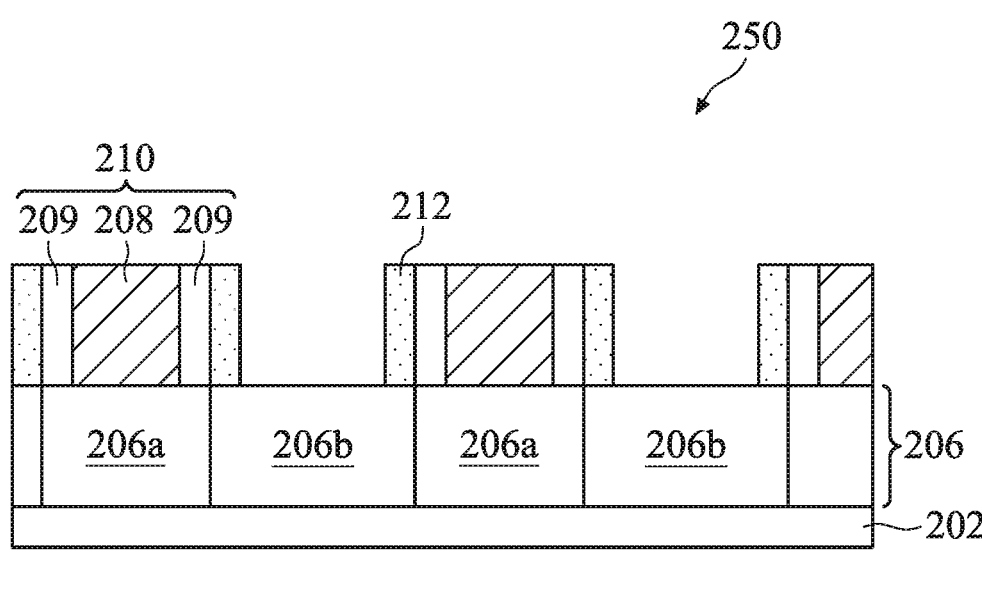

The present disclosure relates generally to integrated circuit (IC) semiconductor devices, and more particularly, to device-level metal contacts and vias in IC semiconductor devices.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Further, spatially relative terms, such as "beneath," "below," "lower," "above," "upper" and the like, may be used herein for case of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/− 10% of the number described, or other values as understood by person skilled in the art. For example, the term "about 5 nm" may encompass the dimension range from 4.5 nm to 5.5 nm.

The present disclosure relates to metal contacts and vias that physically and electrically connect to upper level interconnects and metal lines. The metal contacts include source/drain (S/D) contacts that are formed over S/D epitaxial features. The metal vias include S/D vias that are formed over the S/D contacts as well as gate vias that are formed over metal gates. An all-tungsten metal fill scheme is presented for forming the S/D contacts and S/D vias. This allows for homogeneous interface and excellent uniformity of growth. Further, the contact resistance of the S/D vias and S/D contacts are reduced when each are formed to be without voids by selective tungsten bottom-up metal growth. The gate via also utilizes an all-tungsten scheme by adopting a physical vapor deposition (PVD) tungsten liner and then forming the gate via by isotropic tungsten metal growth over the liner. Although the isotropic metal growth may result in one or more voids in the gate via, device performance is not sacrificed due to the all-tungsten gate via scheme and a more relaxed process window for the gate vias. Further, isotropic metal growth is a cheaper process, thereby simplifying the manufacturing steps.

An all-tungsten contact scheme for S/D contacts, S/D vias, and gate vias is beneficial to overall process integration, improving defect/process control, tool capacity, and usage. To illustrate the various aspects of the all-tungsten contact scheme in the present disclosure, methods of forming a semiconductor device are discussed below. Embodiments shown in the present disclosure are implemented with FinFETs, but the present disclosure is not limited thereto. Those of ordinary skill in the art should appreciate that they may readily use the present disclosure as a basis for designing or modifying other structures for carrying out the same purposes and/or achieving the same advantages of the embodiments introduced herein. For example, the present disclosure may be implemented with gate-all-around FETs such as nanosheet FETs or nanowire FETs.

FIGS. 1A-1B illustrate a flow chart of a method 100 for fabricating metal contacts and vias, in portion or entirety, according to various aspects of the present disclosure. The method 100 is briefly described below. At operation 102, the method 100 receives or is provided with a workpiece that includes gate structures over channel regions on a substrate. The channel regions may be channel regions for a fin FET, a nanowire or nanosheet FET, or other types of multi-gate FETs. The channel region may be part of an active region protruding from a substrate. Adjacent to the channel regions are S/D regions having S/D features. At operation 104, the method 100 deposits a first interlayer dielectric (ILD) layer over the gate structures and over the S/D features. At operation 106, the method 100 forms S/D trenches through the first ILD layer, the S/D trenches exposing top surfaces of the S/D features. At operation 108, the method 100 forms silicide features over the S/D features. At operation 110, the method 100 forms a first tungsten seed layer by physical vapor deposition (PVD) over the silicide features. At operation 112, the method 100 removes top portions of the first tungsten seed layer by a first removal process. At operation 114, the method 100 removes side portions of the first tungsten seed layer by a second removal process. At operation 116, the method 100 forms tungsten S/D contacts by growing tungsten over remaining portions of the first tungsten seed layer by selective bottom-up metal growth. At operation 118, the method 100 performs a first planarization process such that top surfaces of the tungsten S/D contacts are coplanar with the first ILD layer. At operation 120, the method 100 deposits a second ILD layer over the tungsten S/D contacts and over the first ILD layer. At operation 122, the method 100 forms S/D via trenches through the second ILD layer, the S/D via trenches exposing top surfaces of the tungsten S/D contacts. At operation 124, the method 100 forms tungsten S/D vias over the tungsten S/D contacts by selective bottom-up metal growth. At operation 126, the method 100 performs a second planarization process such that top surfaces of the tungsten S/D vias are coplanar with the second ILD layer. At operation 128, the method 100 forms gate via trenches through the first and second ILD layers, the gate via trenches exposing top surfaces of the gate structures. At operation 130, the method 100 forms a second tungsten seed layer by PVD in the gate via trenches. At operation 132, the method 100 forms tungsten gate vias by growing tungsten over the second tungsten seed layer by chemical vapor deposition (CVD) isotropic metal growth.

The method 100 may perform further steps to complete fabrication of a semiconductor device. Additional processing is contemplated by the present disclosure. Additional operations can be provided before, during, and after method 100, and some of the operations described can be moved, replaced, or eliminated for additional embodiments of method 100. Embodiments of the method 100 can be applied to SRAM devices, logic devices, and other devices, particularly when resistance of metal contacts and vias is of a concern. Embodiments of the method 100 can be readily integrated into existing manufacturing flow to simplify process flow while improving device performance.

Method 100 is further described below in conjunction with FIGS. 2-20, which illustrate cross-sectional views of a semiconductor device 200 at intermediate stages of fabrication and processed according to an embodiment of the present disclosure. FIGS. 2-20 have been simplified for the sake of clarity to better understand the inventive concepts of the present disclosure. Additional features can be added in the device 200, and some of the features described below can be replaced, modified, or eliminated in other embodiments of the device 200. The device 200 may be a portion of an integrated circuit (IC) chip, a system on chip (SoC), or portion thereof, that includes various passive and active microelectronic devices such as resistors, capacitors, inductors, diodes, p-type field effect transistors (PFETs), n-type field effect transistors (NFETs), FinFET, nanosheet FETs, nanowire FETs, other types of multi-gate FETs, metal-oxide semiconductor field effect transistors (MOSFETs), complementary metal-oxide semiconductor (CMOS) transistors, bipolar junction transistors (BJTs), laterally diffused MOS (LDMOS) transistors, high voltage transistors, high frequency transistors, other suitable components, or combinations thereof. In some embodiments, the device is included in a non-volatile memory, such as a non-volatile random access memory (NVRAM), a flash memory, an electrically erasable programmable read only memory (EEPROM), an electrically programmable read-only memory (EPROM), other suitable memory type, or combinations thereof.

Referring now to FIG. 2, at operation 102, the method 100 receives a workpiece 250 of the device 200. The workpiece 250 may include a substrate 202 and an active region 206 over the substrate 202. The substrate 202 may be a silicon (Si) substrate, or a substrate having other semiconductor materials such as germanium (Ge), silicon carbide (SiC), silicon germanium (SiGe), or diamond. The active region 206 may be an extension of the substrate 202 that protrudes from the substrate 202. The active region 206 extends lengthwise along the x direction and includes channel regions 206a under metal gate structures 210 and S/D regions 206b between channel regions 206a.

The S/D regions 206b includes S/D features epitaxially grown from the substrate 202 and/or the channel regions 206a. The S/D features may include n-type S/D features that correspond with n-type transistor regions or p-type S/D features that correspond with p-type transistor regions. The S/D features may be formed by an epitaxy process using CVD deposition techniques (for example, VPE and/or UHV-CVD), molecular beam epitaxy, other suitable epitaxial growth processes, or combinations thereof. The epitaxy process can use gaseous and/or liquid precursors, which interact with the composition of substrate 202 and/or the channel regions 206a. In some embodiments, for the n-type transistors, epitaxial S/D features include silicon and can be doped with carbon, phosphorous, arsenic, other n-type dopant, or combinations thereof (for example, forming Si:C epitaxial source/drain features, Si:P epitaxial source/drain features, or Si:C:P epitaxial S/D features). In some embodiments, for the p-type transistors, epitaxial source/drain features include silicon germanium or germanium and can be doped with boron, other p-type dopant, or combinations thereof (for example, forming Si:Ge:B epitaxial source/drain features).

Each of the metal gate structures 210 extends lengthwise along the y direction over one or more channel regions 206a of one or more active regions 206. Each of the metal gate structures 210 includes a metal gate stack 208 and gate spacers 209 along sidewalls of the metal gate stack 208. The gate spacers 209 may include a dielectric material, such as silicon oxide, silicon nitride, silicon carbide, silicon oxynitride, a low-k material, and/or other suitable dielectric materials. FIG. 2 shows single layered gate spacers 209 on sidewalls of the metal gate stacks 208, but the present disclosure is not limited thereto. For example, the gate spacers 209 may be multilayered, and each layer may have different materials for specific design considerations such as etch protection and isolation.

Each of the metal gate stacks 208 includes a gate dielectric layer and a gate electrode disposed on the gate dielectric layer. The gate dielectric layer wraps around bottom and side surfaces of the gate electrode. In some embodiments, the gate dielectric layer includes an interfacial layer and a high-k dielectric layer disposed on the interfacial layer. The gate electrode may be formed by any suitable deposition process, such as ALD, CVD, PVD, HDPCVD, MOCVD, RPCVD, PECVD, LPCVD, ALCVD, APCVD, spin coating, plating, other deposition process, or combinations thereof. The gate electrode may include one or more conductive materials, such as a work function metal layer, a metal fill layer, and/or other proper conductive material layers. The work function layers (if present) may be same or different and may be an n-type work function layer or a p-type work function layer. The gate dielectric layer includes a high-k dielectric material, such as materials having a dielectric constant greater than silicon oxide (k≈3.9). Each of the gate electrodes includes a suitable conductive material, such as aluminum (Al), tungsten (W), cobalt (Co), and/or copper (Cu). Each gate electrode may additionally or collectively include other metals, metal oxides, metal nitrides, other suitable materials, or combinations thereof. In Fin FET structures, the metal gate stacks 208 cover top and side surfaces of a fin-shaped channel in the channel regions 206a. In GAA FET structures, the gate stacks 208 completely wraps around vertically stacked transistor channels in the channel regions 206a (see FIG. 21). In either case, the gate stacks 208 include portions disposed directly above and over the channel regions 206a.

In some embodiments, the workpiece 250 further includes etch stop layers 212 along sidewalls of the metal gate structures 210. For example, the etch stop layers 212 may be disposed adjacent to the gate spacers 209. The etch stop layers 212 may be of a different material composition than the gate spacers 209. The etch stop layers 212 may include silicon nitride, silicon oxynitride, or other suitable materials.

Referring now to FIG. 3, at operation 104, the method 100 deposits a first interlayer dielectric (ILD) layer 302 over the gate structures 210 and over the S/D features in the S/D regions 206b. The first ILD layer 302 may directly contact top surfaces of the gate spacers 209, the gate stacks 208, the etch stop layers 212, and the S/D features in the S/D regions 206b. The first ILD layer 302 fills a space between adjacent metal gate structures 210 and may directly contact side surfaces of the etch stop layers 212. The first ILD layer 302 may be formed by a deposition process (such as CVD, PVD, ALD, HDPCVD, MOCVD, RPCVD, PECVD, LPCVD, ALCVD, APCVD, plating, other suitable methods, or combinations thereof). In some embodiments, the first ILD layer 302 is formed by a flowable CVD (FCVD) process that includes, for example, depositing a flowable material (such as a liquid compound) over the device 200 and converting the flowable material to a solid material by a suitable technique, such as thermal annealing and/or ultraviolet radiation treating. The first ILD layer 302 includes a dielectric material including, for example, silicon oxide, silicon nitride, silicon oxynitride, TEOS formed oxide, PSG, BPSG, low-k dielectric material, other suitable dielectric material, or combinations thereof. Exemplary low-k dielectric materials include FSG, carbon doped silicon oxide, Black Diamond® (Applied Materials of Santa Clara, California), Xerogel, Acrogel, amorphous fluorinated carbon, Parylene, BCB, SiLK (Dow Chemical, Midland, Michigan), polyimide, other low-k dielectric material, or combinations thereof. In the present embodiment, the first ILD layer 302 may have a different material composition from the etch stop layers 212 and gate spacers 209 for etchant selectivity purposes. For example, where the etch stop layers 212 includes silicon nitride or silicon oxynitride, the gate spacers 209 may include silicon oxide and the first ILD layer 302 may include a TEOS formed oxide.

Figure 4:
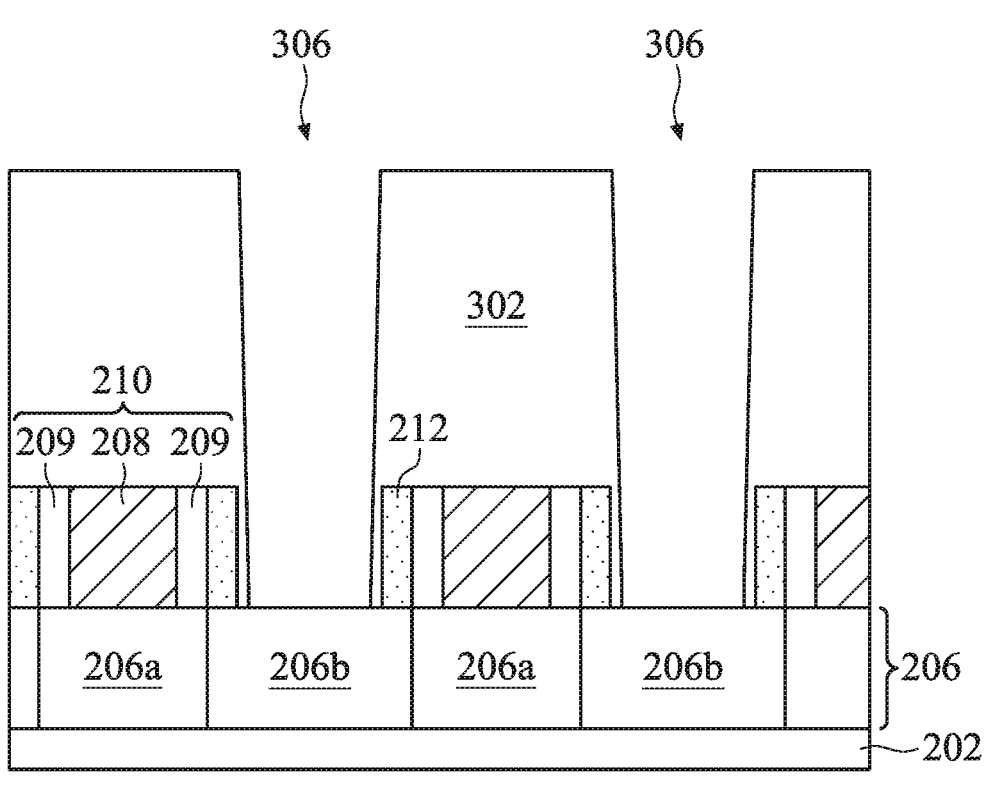

Referring now to FIG. 4, at operation 106, the method 100 forms S/D trenches 306 through the first ILD layer 302 and between gate structures 210. The S/D trenches 306 exposes top surfaces of the S/D features in the S/D regions 206b. As shown in FIG. 4, the S/D trenches 306 are formed such that a thin layer of the first ILD layer 302 remains on side surfaces of the etch stop layers 212. In other embodiments, the S/D trenches 306 are formed such that side surfaces of the etch stop layers 212 are partially or fully exposed. The S/D trenches 306 may be formed by an etching process such as a dry etching process, a wet etching process, other suitable etching process, or combinations thereof. In an embodiment, a lithography process is performed to form a patterned mask layer that covers metal gate structures 210, and the etching process uses the patterned mask layer as an etch mask when forming the S/D trenches 306.

Figure 5:
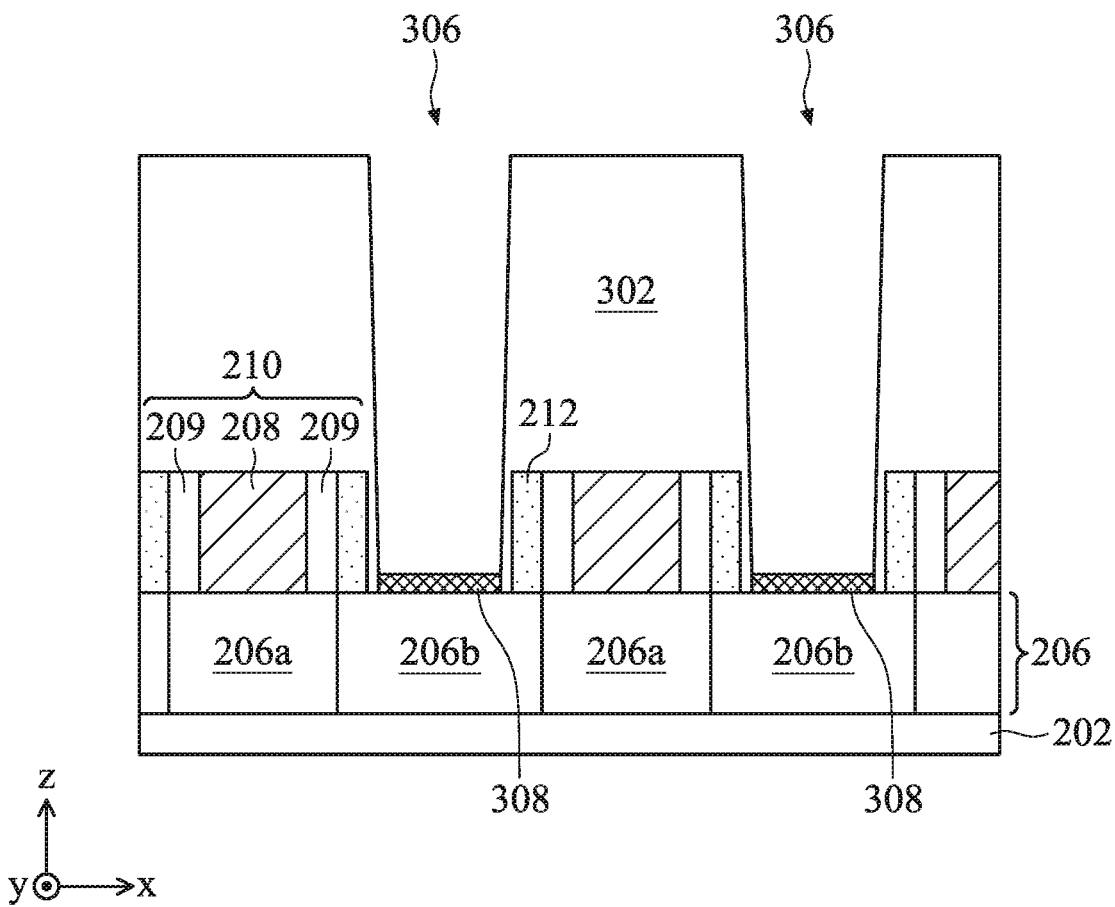

Referring now to FIG. 5, at operation 108, the method 100 forms silicide features 308 over the S/D features in the S/D regions 206b. In some embodiments, the silicide features 308 may also form on side portions of each of the S/D trenches 306 (not shown). The silicide features 308 may include a layer of titanium silicide (TiSi). In other embodiments, the silicide features 308 may include cobalt silicide (CoSi), ruthenium silicide (RuSi), nickel silicide (NiSi), TiSiGe, CoSiGe, RuSiGe, NiSiGe, other suitable silicides, or combinations thereof. Different materials may be used depending on the application. In an example, titanium silicide is used in an n-type transistor, and cobalt silicide is used in a p-type transistor. The silicide features 308 may be formed by any suitable method. For example, a metal layer (e.g., titanium) may be deposited over the device 200 by a deposition process such as CVD, ALD, PVD, other suitable processes, or combinations thereof. Then, the device 200 is annealed to allow the metal layer and the semiconductor materials of the S/D features to react and form the silicide features 308. Thereafter, the un-reacted metal layer is removed, leaving the silicide features 308 as a layer over top surfaces of the S/D features. In another embodiment, a metal silicide layer is directly and conformally deposited over the device 200 and into the S/D trenches 306. Thereafter, side portions of the metal silicide layer are removed as part of the first and second removal processes in operations 112 and 114 described below. In this case, the remaining portion of the metal silicide layer becomes the silicide features 308.

Figure 6:
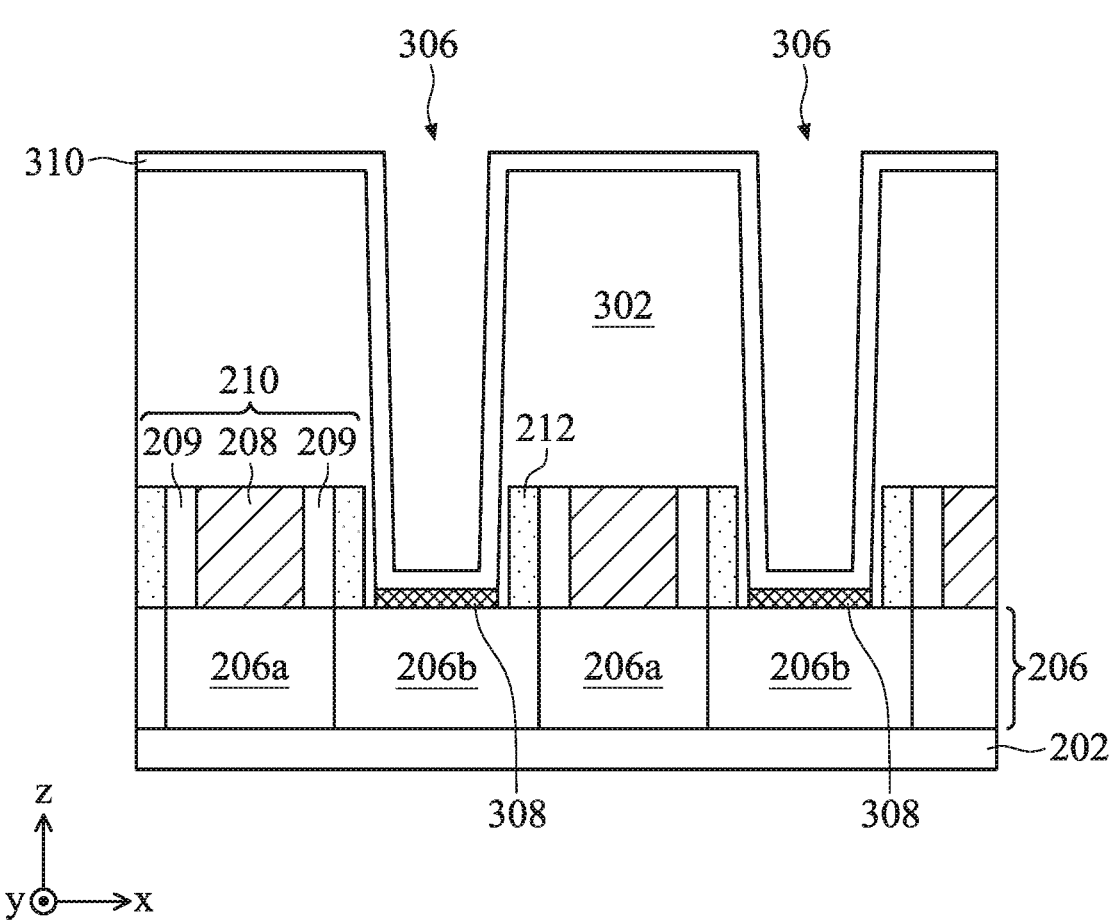

Referring to FIG. 6, at operation 110, the method 100 forms a first tungsten seed layer 310 by physical vapor deposition (PVD) over the silicide features 308. The first tungsten seed layer 310 is formed conformally over top surfaces of the first ILD layer 302, top surfaces of the silicide features 308, and side surfaces of the first ILD layer 302. In other words, bottom portions of the first tungsten seed layer 310 directly lands on each of the silicide features 308, and side portions of the first tungsten seed layer 310 directly lands on side portions of each of the S/D trenches 306. In embodiments where a metal silicide is directly and conformally deposited over the device 200, side portions of the first tungsten seed layer 310 directly lands on side portions of the silicide features 308 (not shown).

The first tungsten seed layer 310 is formed using PVD instead of CVD or other deposition processes because a pure metal precursor layer is desirable. To achieve low resistance seamless fill, tungsten is also chosen for the subsequent bottom-up metal growth for single grain or less grain boundary interface. The first tungsten seed layer 310 may have dual functions. First, the first tungsten seed layer 310 acts as a PVD metal cap layer to protect the silicide features 308. The silicide features 308 upon formation may be exposed to atmosphere or other air that contains oxygen. Thus, there is risk of the silicide features 308 getting oxidized, which would increase its resistance. As such, the first tungsten seed layer (or PVD cap layer) 310 should be thick enough to act as a cap to prevent unwanted silicide oxidation. Second, the first tungsten seed layer 310 acts as a proper landing ground for subsequent selective bottom-up metal growth. As such, no barrier layer or glue layer (e.g., made of titanium (Ti), titanium nitride (TiN), tantalum (Ta), or tantalum nitride (TaN)) is formed over the silicide features 308. This helps reduce resistivity because the first tungsten seed layer 310 has lower resistivity than the barrier or glue layers.

Because the first tungsten seed layer 310 is formed to prepare for subsequent bottom-up metal growth, side portions of the first tungsten seed layer 310 are to be removed. This is to allow for directional vertical growth from the bottom portions of the first tungsten seed layer 310 without horizontal growth from the side portions of the first tungsten seed layer 310. Because the growth is directional in the vertical direction, (i.e., no growth in the horizontal direction), the metal fills are formed to be without voids. To achieve this, top and side portions of the first tungsten seed layer 310 are removed at operations 112 and 114 to prepare for subsequent bottom-up metal growth.

Figure 7:
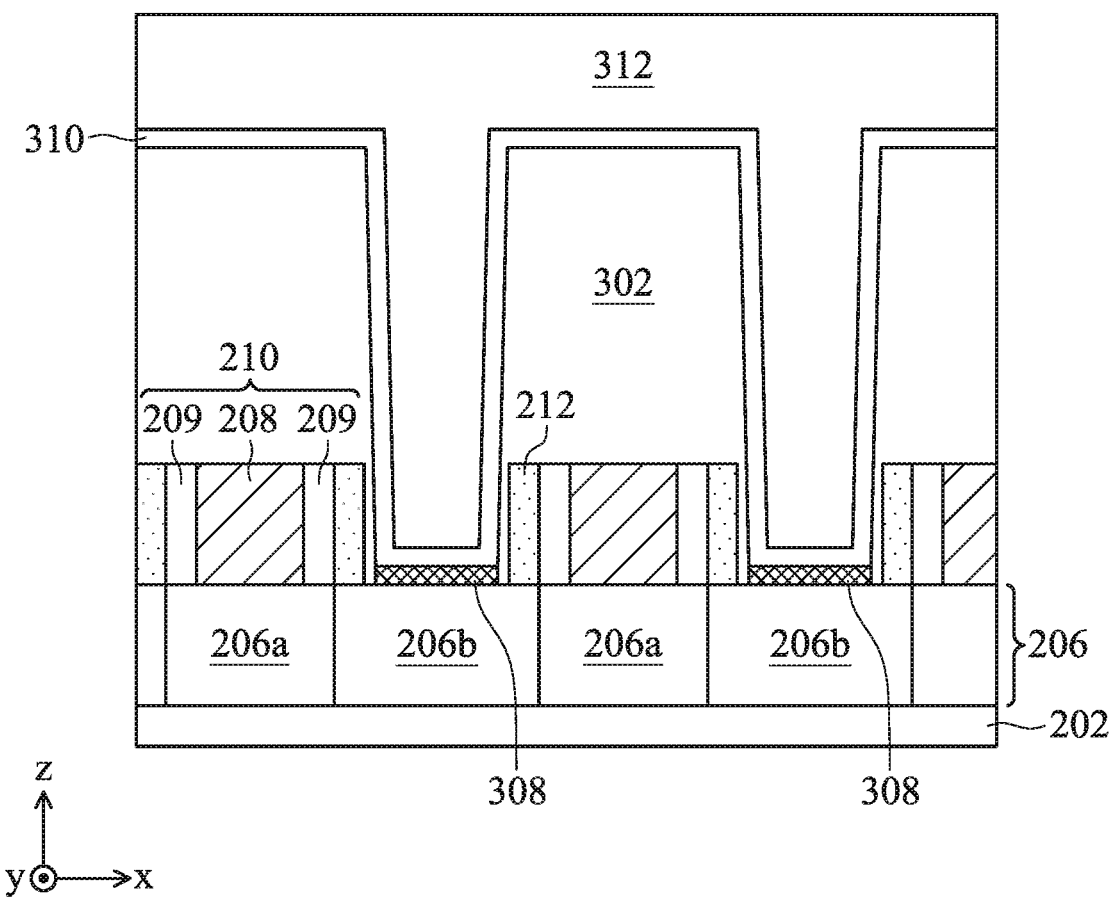
Figure 8:
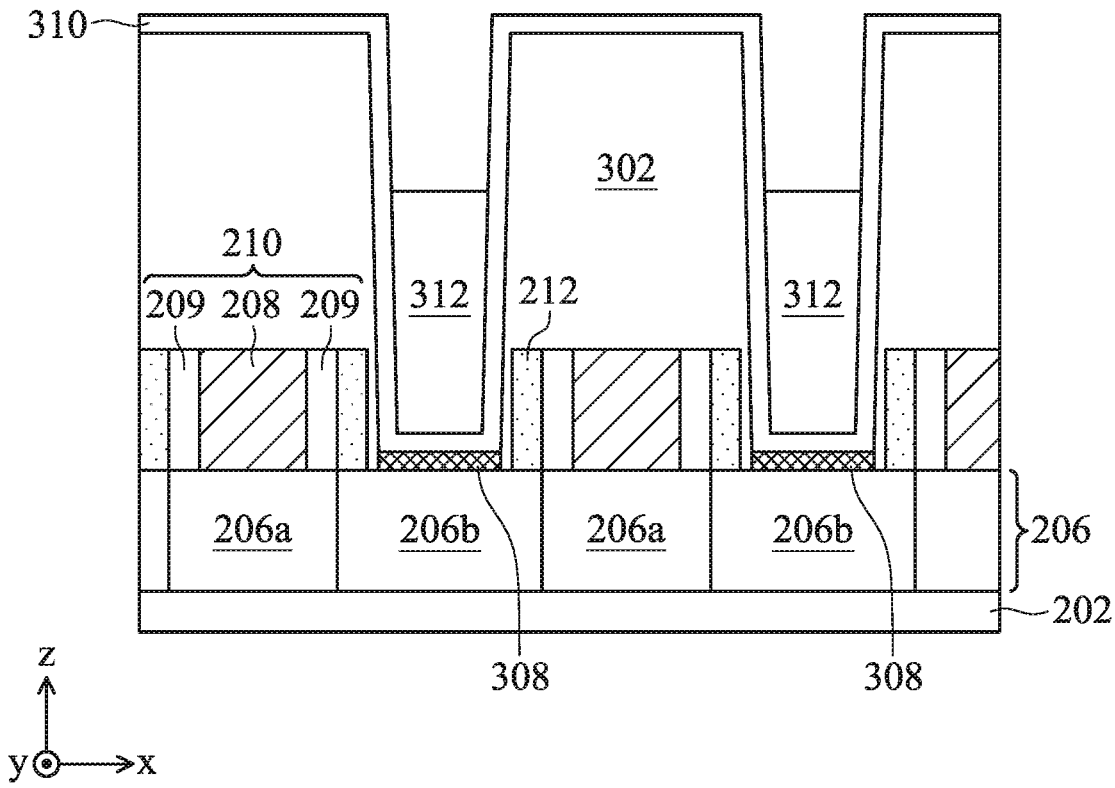
Figure 9:
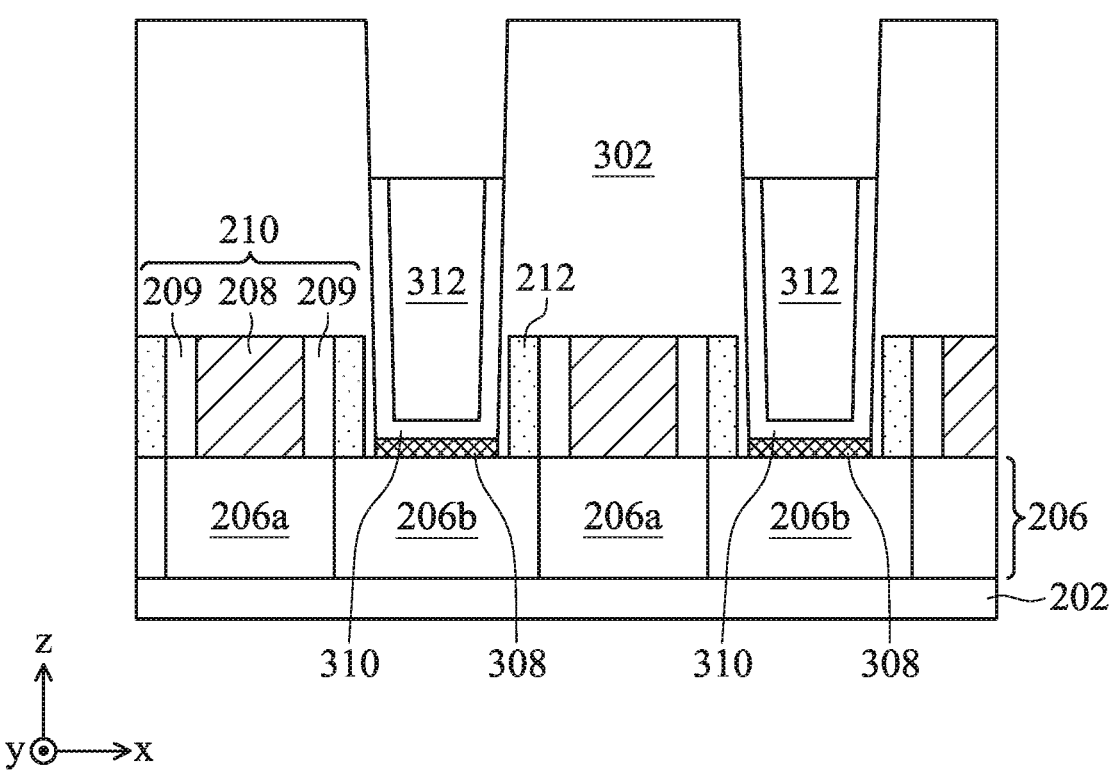

Referring to FIGS. 7-9, at operation 112, the method 100 removes top portions of the first tungsten seed layer 310 by a first removal process. Referring to FIG. 7, the first removal process includes first depositing a sacrificial layer 312 in the S/D trenches 306 and over the first tungsten seed layer 310. The sacrificial layer 312 is to be removed later, and the sacrificial layer 312 may be a bottom anti-reflective coating (BARC) layer. The BARC layer is formed by spin coating, which is a cheaper process than CVD or PVD. Now referring to FIG. 8, the first removal process includes partially etching the sacrificial layer 312 to expose top portions of the first tungsten seed layer 310. The top portions of the first tungsten seed layer 310 include portions on top and side surfaces of the first ILD layer 302. Since the sacrificial layer 312 is only partially etched, a lower portion of the first tungsten seed layer 310 remains covered. Now referring to FIG. 9, the first removal process includes etching away the exposed top portions of the first tungsten seed layer 310 by using the sacrificial layer 312 as an etch stop film.

Figure 10:
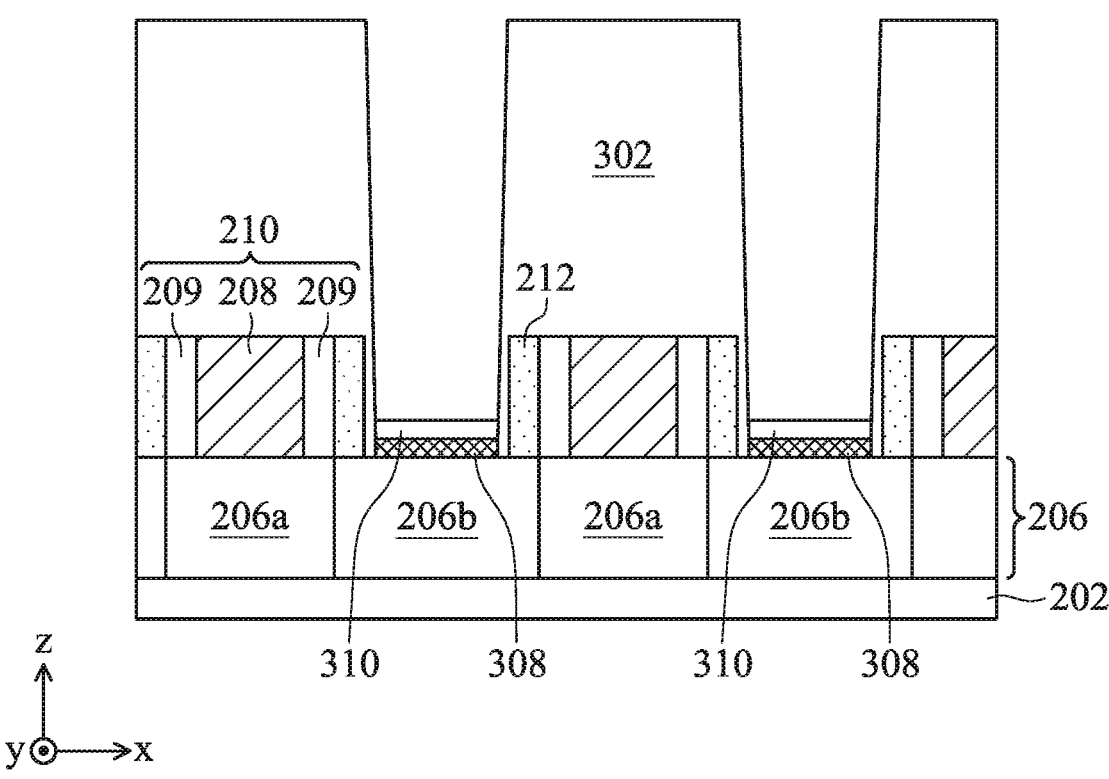

Referring to FIG. 10, at operation 114, the method 100 removes remaining side portions of the first tungsten seed layer 310 by a second removal process. The second removal process includes etching the sacrificial layer 312 to expose additional side portions of the first tungsten seed layer 310 and then etching the additional side portions of the first tungsten seed layer 310. This process may repeat until only a bottom portion of the first tungsten seed layer 310 remains on the silicide features 308.

In embodiments where a metal silicide is directly and conformally deposited over the device 200, top and side portions of the metal silicide is removed in the same process the top and side portions of the first tungsten seed layer 310 is removed (i.e., during the first and second removal process). In another embodiment, instead of a first and second removal process etching the sacrificial layer 312 and the first tungsten seed layer 310 separately, the sacrificial layer 312 and the first tungsten seed layer 310 may be etched together by a controlled etching process. In either case, only bottom portions of the first tungsten seed layer 310 remain. In an embodiment, the bottom portions of the first tungsten seed layer 310 have a thickness ranging from 3 to 10 nm and has a top surface substantially below a top surface of the gate structures 210.

Figure 11:
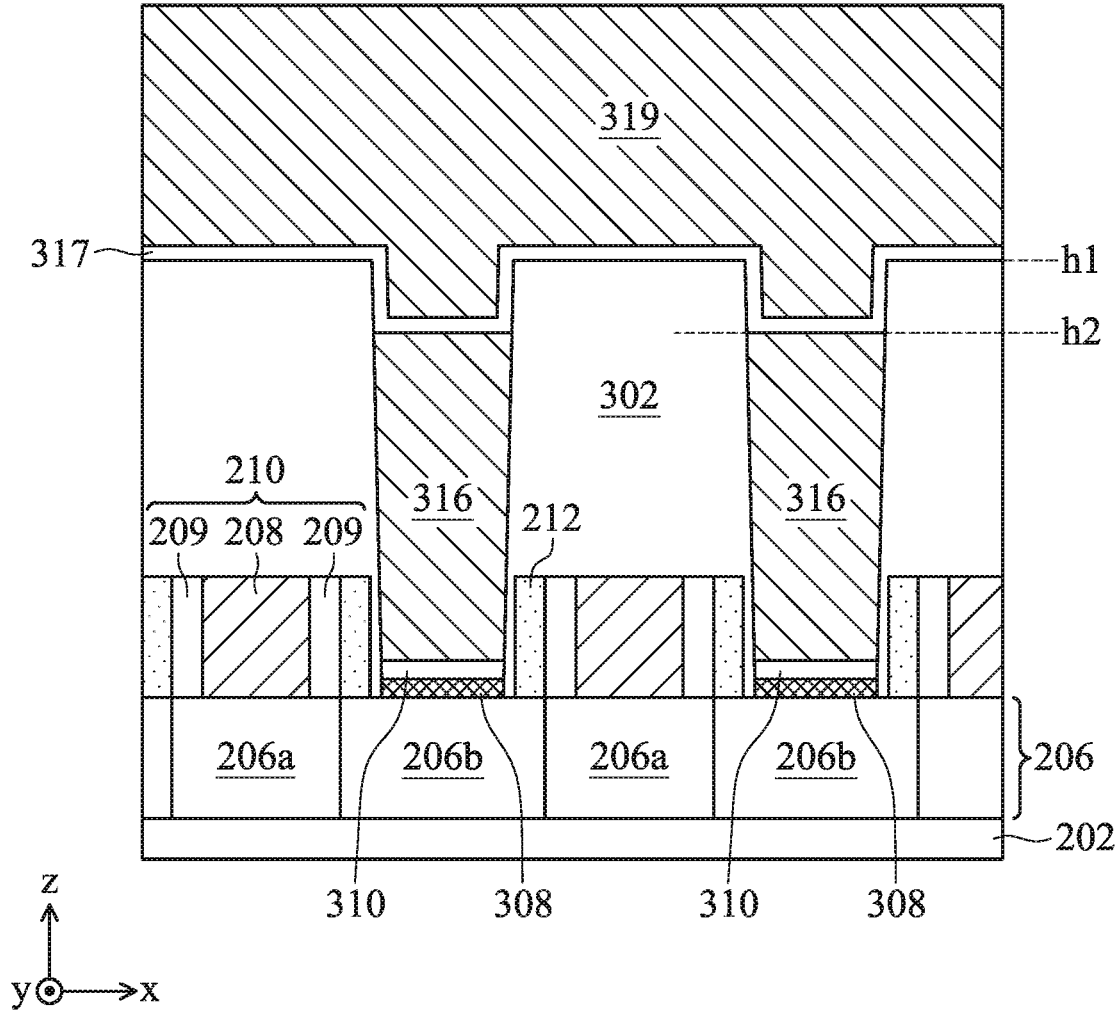

Referring to FIG. 11, at operation 116, the method 100 forms tungsten S/D contacts 316 by growing tungsten over the remaining portions of the first tungsten seed layer 310. Growing tungsten on tungsten allows for good interface contact and single grain boundary, lowering contact resistance. This is achieved by bottom-up deposition, also referred to as selective bottom-up metal growth. The bottom-up deposition may be performed by a suitable method, such as CVD or ALD. This deposition is anisotropic and directional in the vertical direction. In the embodiment shown, the tungsten S/D contacts 316 are grown to a height h2 below a height h1. The height h1 is the height of the first ILD layer 302. Since bottom-up deposition may be more time-consuming and more costly than other methods, the tungsten S/D contacts 316 only grow until they are higher than a later CMP surface height h3 (see FIG. 12). Further, because bottom-up deposition is directional, growing the S/D contacts 316 above the top surface of the first ILD layer 302 may produce a bump that is undesirable for a later CMP process. As such, the S/D contacts 316 do not grow higher than the height h1. At this stage of fabrication, top surfaces of the S/D contacts 316 are below a top surface of the first ILD layer 302.

Still referring to FIG. 11, after forming or as part of forming the S/D contacts 316, the operation 116 includes forming a conformal conductive barrier layer 317 over the S/D contacts 316 and over top and side surfaces of the first ILD layer 302. The operation 116 further includes forming an over-burden metal 319 over the conformal conductive barrier layer 317 and overfilling the S/D trenches 306. The barrier layer 317 acts as a glue layer between the S/D contacts 316 and the over-burden metal 319. The barrier layer 317 may have a different material composition than tungsten and it prepares for the subsequent forming of the over-burden metal 319. In an embodiment, the barrier layer 317 includes titanium (Ti), titanium nitride (TiN), tantalum (Ta), or tantalum nitride (TaN). In another embodiment, the barrier layer 317 may include tungsten. The over-burden metal 319 is formed by isotropic chemical vapor deposition (CVD), which is a faster and cheaper metal growth process compared to selective bottom-up growth. Further, since the growth is isotropic and formed over the conformal conductive barrier layer 317, it produces a more uniform top surface when it is formed above the first ILD layer 302. This is desirable to prepare for a subsequent CMP process. In an embodiment, the over-burden metal 319 may include tungsten. In other embodiments, the over-burden metal 319 may include ruthenium (Ru), copper (Cu), nickel (Ni), cobalt (Co), tantalum (Ta), or molybdenum (Mo).

Figure 12:
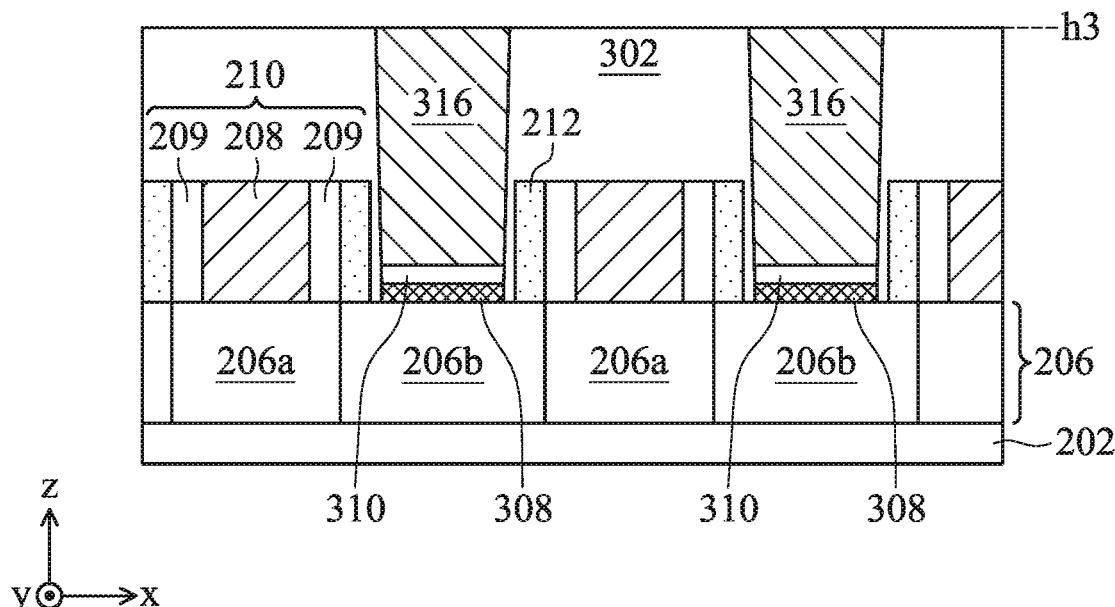

Now referring to FIG. 12, at operation 118, the method 100 performs a first planarization process such that top surfaces of the tungsten S/D contacts 316 are coplanar with top surfaces of the first ILD layer 302. The first planarization process may be a CMP process, and the first planarization process removes the conformal conductive barrier layer 317 and the over-burden metal 319. The first planarization process planarizes the first ILD layer 302 and the tungsten S/D contacts 316 to a height h3 lower than the height h2.

Figure 13:
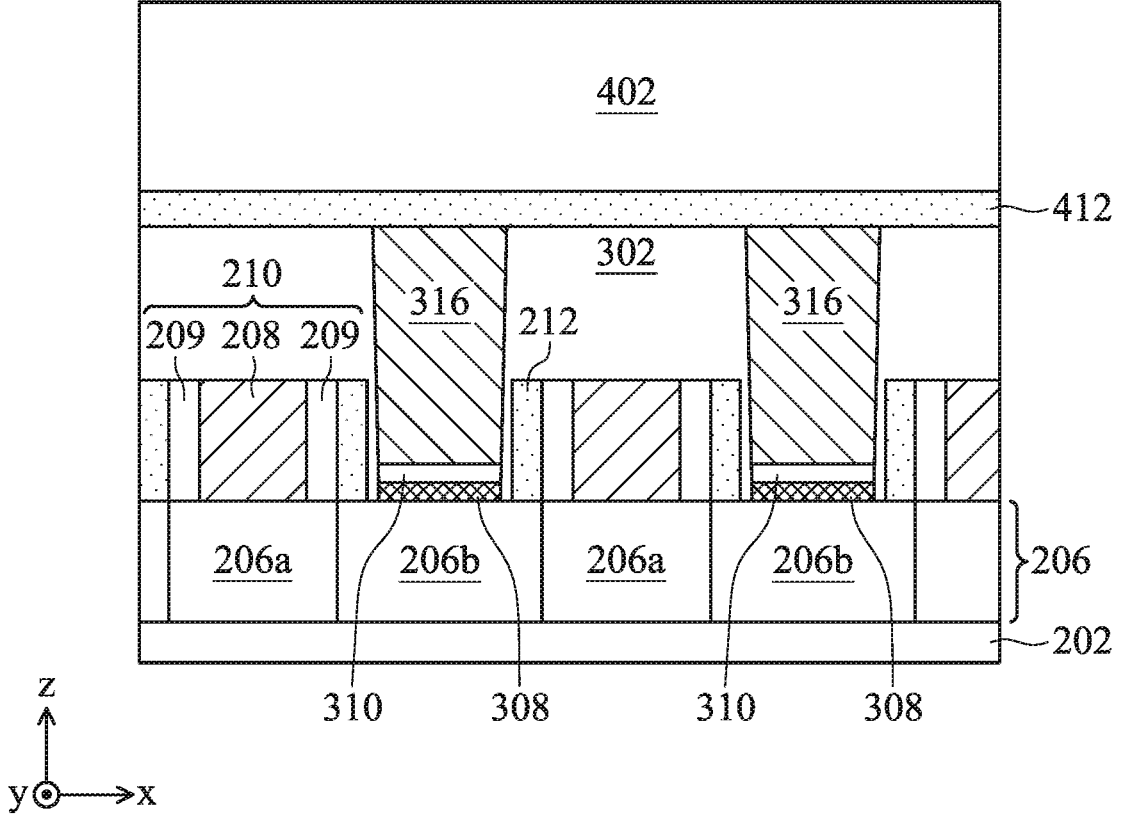

Referring to FIG. 13, at operation 120, the method 100 deposits a second ILD layer 402 over the tungsten S/D contacts 316 and over the first ILD layer 302. As part of or before the operation 120, the method 100 first deposits a contact etch stop layer (CESL) 412 over the planarized surfaces of the first ILD layer 302 and the tungsten S/D contacts 316. Thereafter, the second ILD layer 402 is formed over the CESL 412. The CESL 412 may be similar to the etch stop layers 212 in composition, and the second ILD layer 402 may be similar to the first ILD layer 302 in composition.

Figure 14:
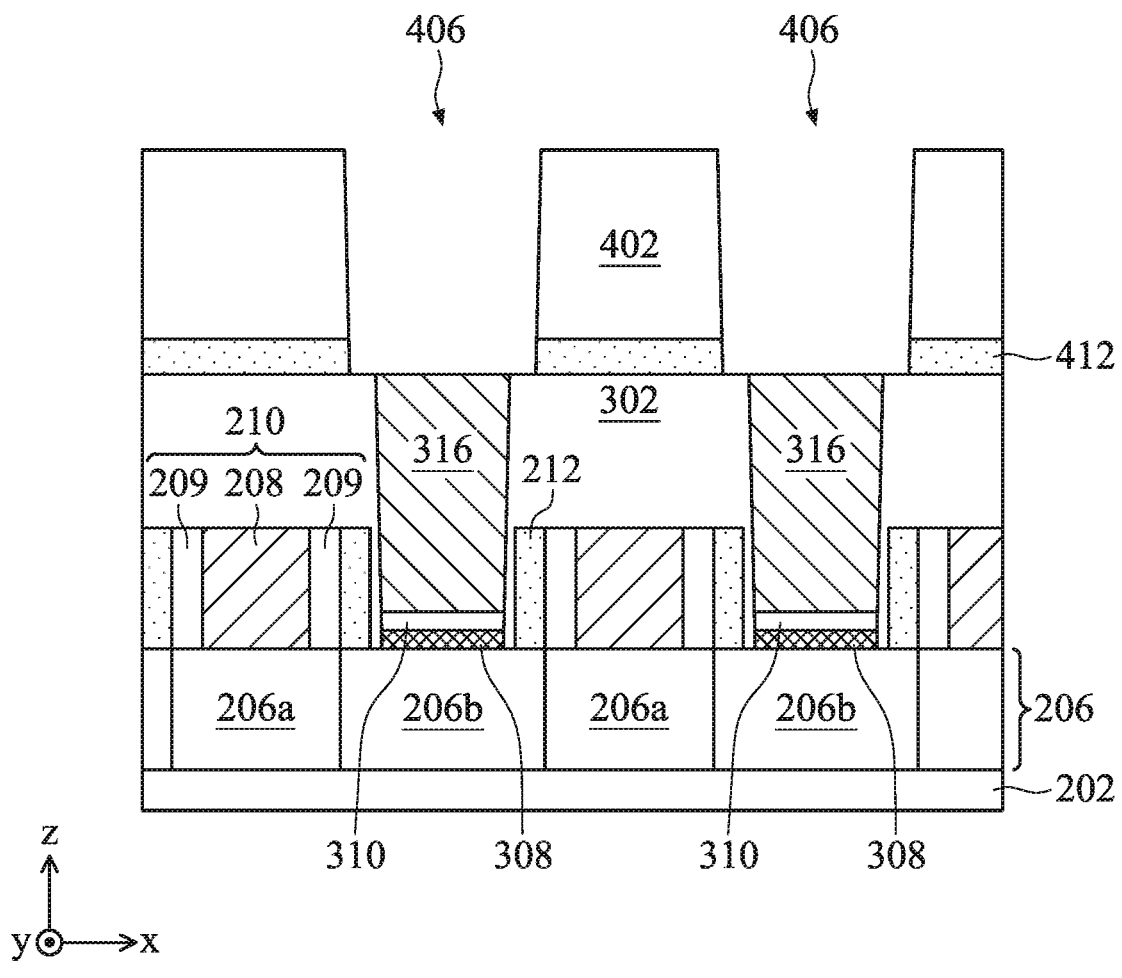

Referring to FIG. 14, at operation 122, the method 100 forms S/D via trenches 406 through the second ILD layer 402 and the CESL 412. The S/D via trenches 406 expose top surfaces of the tungsten S/D contacts 316. In an embodiment, the S/D via trenches 406 also expose a top surface of the first ILD layer 302. For example, as shown, the S/D via trenches 406 are formed wider in the x direction than the S/D trenches 306, thereby exposing the first ILD layer 302. This is to ensure full and proper contact between later formed S/D vias 416 and the S/D contacts 316, lowering contact resistance. The S/D via trenches 406 may be formed by an etching process such as a dry etching process, a wet etching process, other suitable etching process, or combinations thereof. In an embodiment, the etching process is a multi-step etch process. For example, the etching process may include alternative etchants to separately and alternately remove the second ILD layer 402 and the CESL 412. In an embodiment, a lithography process is performed to form a patterned mask layer and the etching process uses the patterned mask layer as an etch mask when forming the S/D via trenches 406.

Referring to FIG. 15, at operation 124, the method 100 forms tungsten S/D vias 416 by growing tungsten over the exposed top surfaces of the tungsten S/D contacts 316. Like how the tungsten S/D contacts 316 are formed, growing the tungsten S/D vias 416 is achieved by bottom-up deposition, also referred to as selective bottom-up metal growth. Note that no additional tungsten seed layer by PVD is needed and the S/D vias 416 can directly grow from the S/D contacts 316. This is because the tungsten S/D contacts 316 is itself a suitable seed layer for subsequent tungsten growth. And like the interface between the first tungsten seed layer 310 and the tungsten S/D contacts 316, here, growing tungsten S/D vias 416 on tungsten S/D contacts 316 allows for good interface contact and single grain boundary, lowering contact resistance. The bottom-up deposition may be performed by a suitable method, such as CVD or ALD. This deposition is anisotropic and directional in the vertical direction. In the embodiment shown, the tungsten S/D vias 416 are grown to a height h5 below a height h4. The height h4 is the height of the second ILD layer 402. Since bottom-up deposition may be more time-consuming and more costly than other methods, the tungsten S/D vias 416 only grow until they are higher than a later CMP surface height h6 (see FIG. 16). Further, because bottom-up deposition is directional, growing the S/D vias 416 above the top surface of the second ILD layer 402 may produce a bump that is undesirable for a later CMP process. As such, the S/D vias 416 do not grow higher than the height h4, and at this stage of fabrication, top surfaces of the S/D vias 416 is below a top surface of the second ILD layer 402.

Still referring to FIG. 15, after forming or as part of forming the S/D vias 416, the operation 124 includes forming a conformal conductive barrier layer 417 over the S/D vias 416 and over top and side surfaces of the second ILD layer 402. The operation 124 further includes forming an over-burden metal 419 over the conformal conductive barrier layer 417 and overfilling the S/D via trenches 406. The barrier layer 417 acts as a glue layer between the S/D vias 416 and the over-burden metal 419. The barrier layer 417 may have a different material composition than tungsten and it prepares for the subsequent forming of the over-burden metal 419. In an embodiment, the barrier layer 417 includes titanium (Ti), titanium nitride (TiN), tantalum (Ta), or tantalum nitride (TaN). In another embodiment, the barrier layer 417 may include tungsten. The over-burden metal 419 is formed by isotropic chemical vapor deposition (CVD), which is a faster and cheaper metal growth process compared to selective bottom-up growth. Further, since the growth is isotropic and formed over the conformal conductive barrier layer 417, it produces a more uniform top surface when it is formed above the second ILD layer 402. This is desirable to prepare for a subsequent CMP process. In an embodiment, the over-burden metal 419 may include tungsten. In other embodiments, the over-burden metal 419 may include ruthenium (Ru), copper (Cu), nickel (Ni), cobalt (Co), tantalum (Ta), or molybdenum (Mo).

Figure 16:
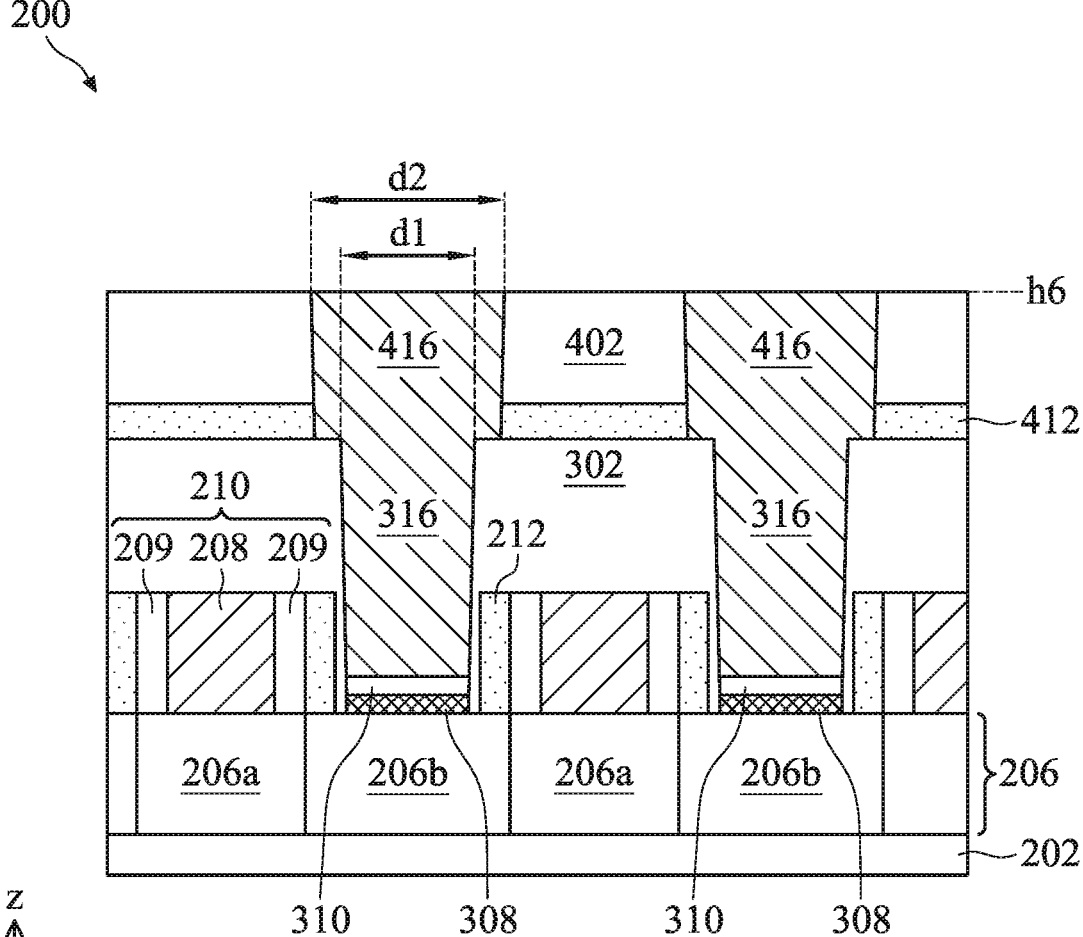

Now referring to FIG. 16, at operation 126, the method 100 performs a second planarization process such that top surfaces of the tungsten S/D vias 416 are coplanar with top surfaces of the second ILD layer 402. The second planarization process may be a CMP process, and the second planarization process removes the conformal conductive barrier layer 417 and the over-burden metal 419. The second planarization process planarizes the second ILD layer 402 and the tungsten S/D vias 416 to a height h6 lower than the height h5. Note that at this stage of fabrication, the tungsten S/D vias 416 are formed wider in the x direction than the tungsten S/D contacts 316 (i.e., width d2 is greater than width d1). As such, the tungsten S/D vias 416 directly contacts a top surface of the first ILD layer 302.

Figure 17:
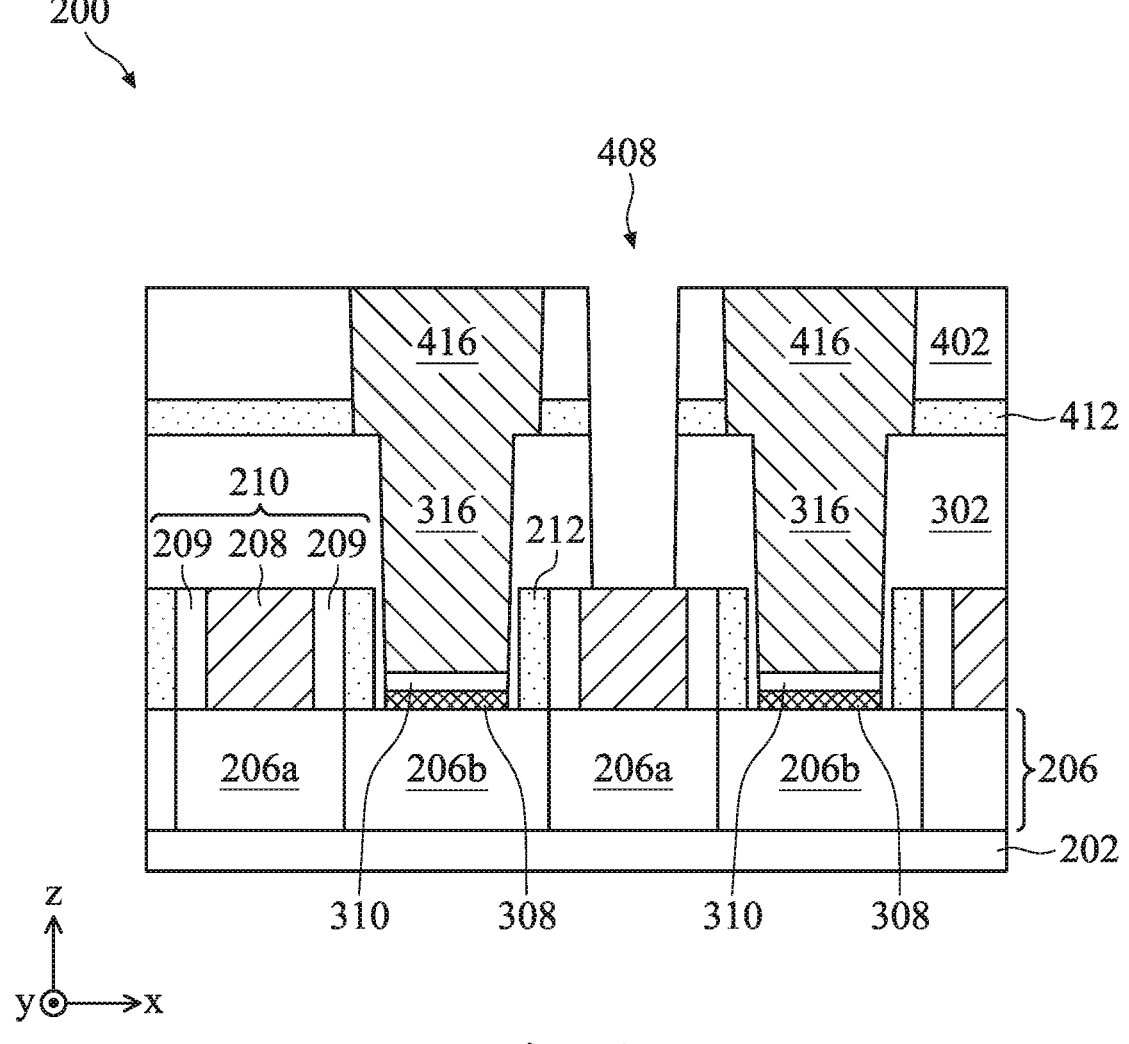

Referring to FIG. 17, at operation 128, the method 100 forms gate via trenches 408 through the second ILD layer 402, the CESL 412, and the first ILD layer 302. FIG. 17 shows one gate via trench 408, but the present disclosure contemplates that multiple gate via trenches 408 may be formed. The gate via trenches 408 expose top surfaces of the gate structures 210 (specifically the metal gate stacks 208). The gate via trenches 408 may be formed by an etching process such as a dry etching process, a wet etching process, other suitable etching process, or combinations thereof. In an embodiment, the etching process is a multi-step etch process. For example, the etching process may include alternative etchants to separately and alternately remove the second ILD layer 402, the CESL 412, and the first ILD layer 302. In an embodiment, a lithography process is performed to form a patterned mask layer and the etching process uses the patterned mask layer as an etch mask when forming the gate via trenches 408.

Figure 18:
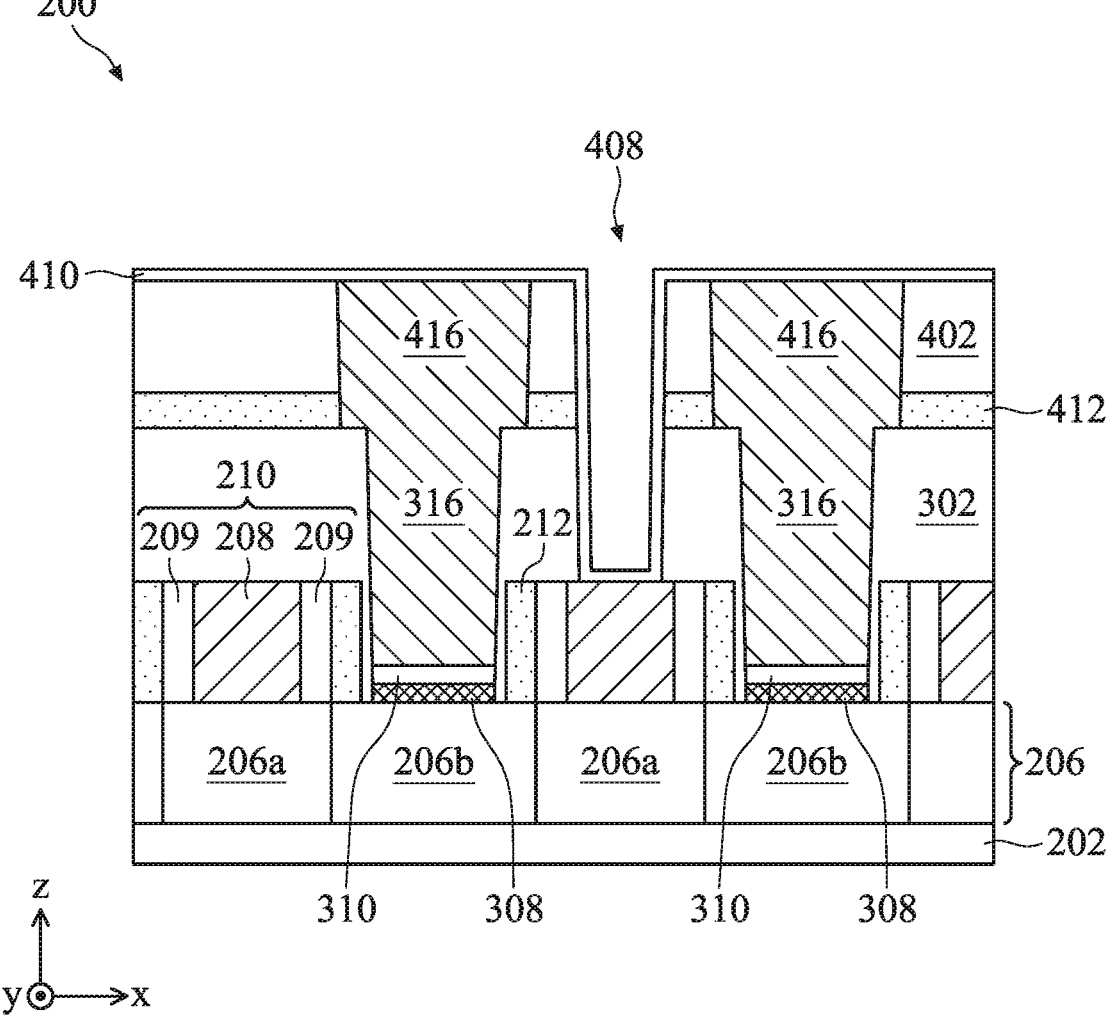

Referring to FIG. 18, at operation 130, the method 100 forms a second tungsten seed layer 410 by PVD in the gate via trenches 408 and over the metal gate structures 210. The second tungsten seed layer 410 is formed conformally over top surfaces of the second ILD layer 402, top surfaces of the metal gate stacks 208, side surfaces of the first and second ILD layers 302 and 402, and side surfaces of the CESL 412. In other words, bottom portions of the second tungsten seed layer 410 directly lands on each of the metal gate stacks 208, and side portions of the second tungsten seed layer 410 directly lands on side portions of each of the gate via trenches 408.

The second tungsten seed layer 410 is formed using PVD instead of CVD or other deposition processes because a pure metal precursor layer is desirable. Note that the second tungsten seed layer 410 may act as a conductive liner for subsequent formation of the gate via 516. Instead of using a traditional conductive barrier layer (e.g., made of titanium (Ti), titanium nitride (TiN), tantalum (Ta), or tantalum nitride (TaN)), a tungsten liner is used to help reduce resistivity. A tungsten liner also helps prepare for the subsequent tungsten metal growth for single grain or less grain boundary interface.

Figure 19:
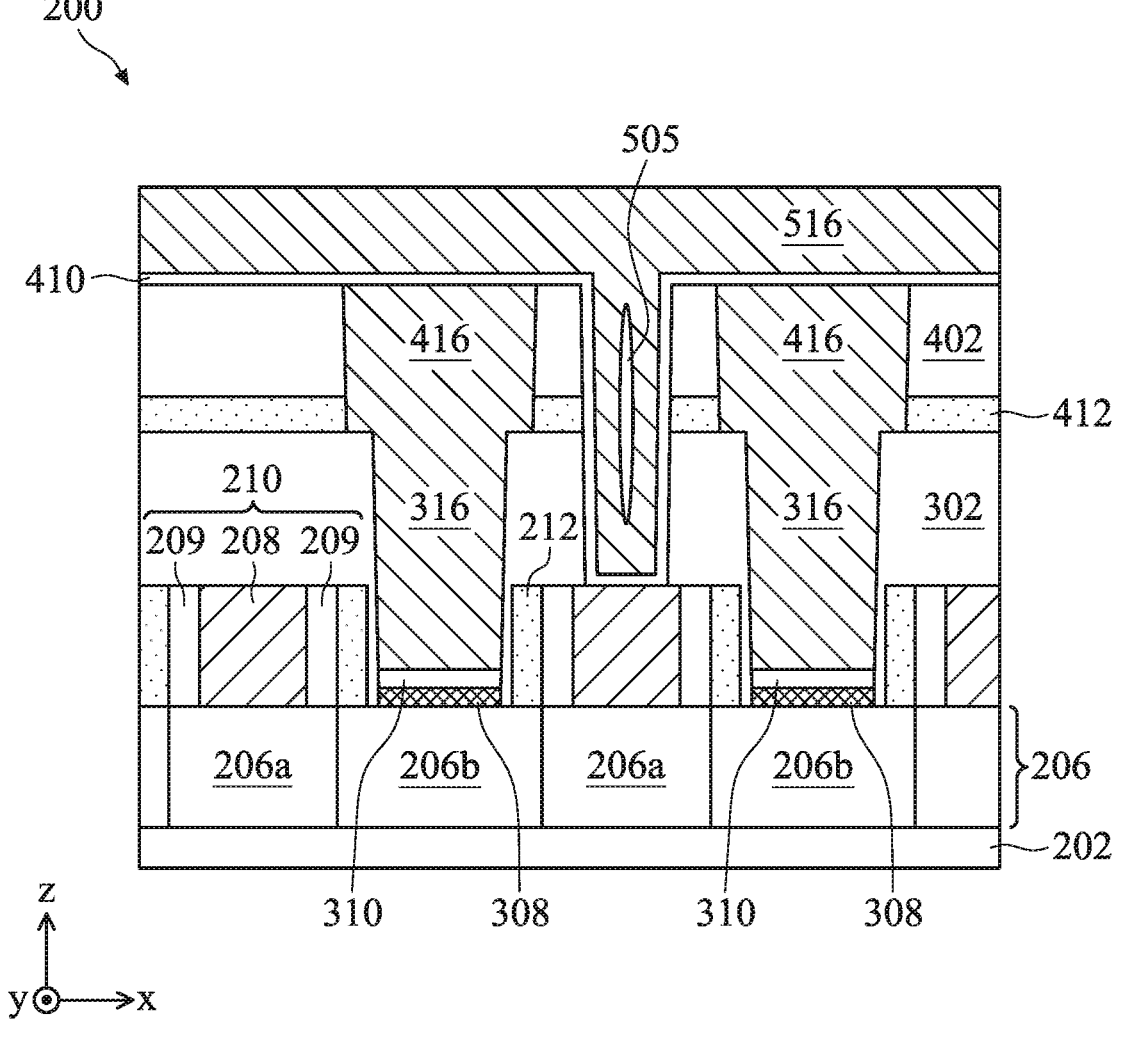

Referring to FIG. 19, at operation 132, the method 100 forms tungsten gate vias 516 by growing tungsten over the second tungsten seed layer 410. The gate vias 516 are formed by chemical vapor deposition (CVD) and they are formed by isotropic metal growth instead of bottom-up deposition. As such, at operation 132, top and side portions of the second tungsten seed layer 410 remain. This is unlike the process for forming the tungsten S/D contacts 316, where top and side portions of the first tungsten seed layer 310 were removed. Since the tungsten gate vias 516 are formed by CVD isotropic metal growth, tungsten is also grown in the horizontal direction from side surfaces of the second tungsten seed layer 410. As such, one or more voids 505 (also referred to as seams or air gaps) may be formed in the tungsten gate vias 516. Even so, due to the all-tungsten scheme and the more relaxed process window for forming gate vias, device performance is not sacrificed. Further, by using CVD isotropic growth for the gate vias 516, the manufacturing steps are simplified. That is, no extra removal process is necessary for the second tungsten seed layer 410, and no extra deposition of over-burden metal is necessary. As shown, the CVD isotropic growth grows tungsten over top surfaces of the second tungsten seed layer 410. And no additional over-burden metal deposition is needed before performing a planarization process.

Figure 20:
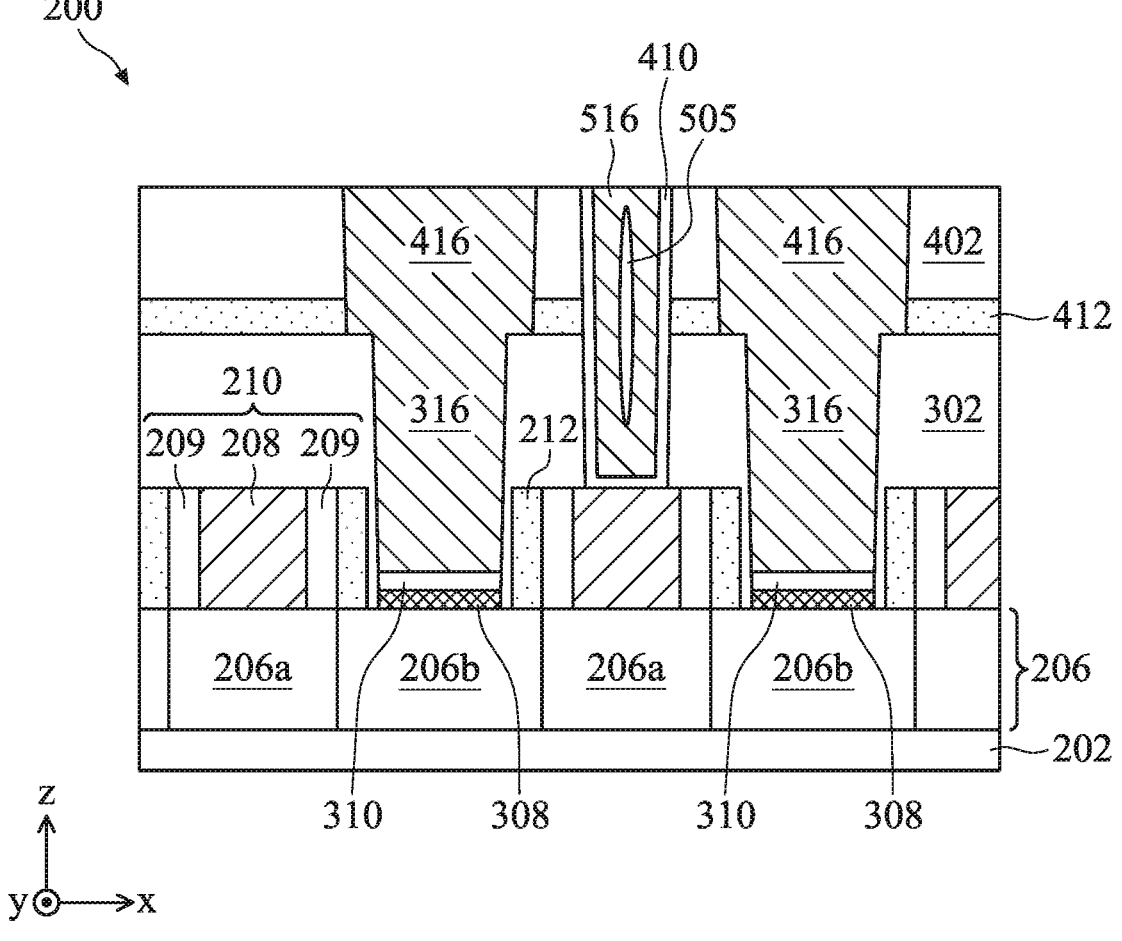

Now referring to FIG. 20, as part of forming the tungsten gate vias 516, a third planarization process is performed such that top surfaces of the tungsten gate vias 516 are coplanar with top surfaces of the tungsten S/D vias 416 and the second ILD layer 402. The third planarization process may be a CMP process, and the third planarization process removes top portions of the second tungsten seed layer 410 over the second ILD layer 402.

The device 200 in FIG. 20 is described in more detail below. The tungsten S/D contacts 316 penetrate through and is coplanar with a top surface of the first ILD layer 302. The tungsten S/D vias 416 penetrate through the second ILD layer 402 and the CESL 412. The tungsten S/D vias 416 may be wider than the tungsten S/D contacts 316 and lands on the tungsten S/D contacts 316 and the first ILD layer 302. The tungsten gate vias 516 penetrates through the second ILD layer 402, the CESL 412, and the first ILD layer 302. The tungsten gate vias 516 have top surfaces coplanar with top surfaces of tungsten S/D vias 416. The tungsten gate vias 516 lands on the metal gate stacks 208. The tungsten S/D contacts and S/D vias 316 and 416 are formed by bottom-up deposition and without voids. The tungsten gate vias 516 are formed by CVD isotropic growth with one or more voids 505. The tungsten S/D contacts 316 are lined with a first tungsten seed layer 310 only on a bottom horizontal interface between the S/D contacts 316 and silicide features 308. The tungsten S/D vias 416 are not lined with any seed layer. The tungsten gate vias 516 are lined with a second tungsten seed layer 410 that surrounds sidewall and bottom surfaces of the tungsten gate vias 516. The first and second tungsten seed layer 310 and 410 are formed by PVD metal deposition.

Although the material for the seed layers and the metal contacts/vias are both tungsten, the seed layers have a greater metal conductivity than the metal contacts/vias. This is because the seed layers are formed by PVD while the metal contacts/vias are formed by bottom-up deposition or CVD isotropic growth, where halogen gases may mingle with the deposited metal. As such, the PVD-formed tungsten may also have a lower resistivity and higher reflectivity than the CVD-formed tungsten.

An all-tungsten contact scheme for S/D contacts, S/D vias, and gate vias is demonstrated. Method 100 described forming various seed layers (e.g., first tungsten seed layer 310 and second tungsten seed layer 410). These seed layers have been referred to as separate layers from the metal contacts and/or vias formed thereon. However, although formed by separate processes, these seed layers may also be referred to as part of the corresponding metal contacts or vias. For example, the first tungsten seed layer 310 is a part of the tungsten S/D contacts 316, and the second tungsten seed layer 410 is a part of the tungsten gate vias 516.

Figure 21:
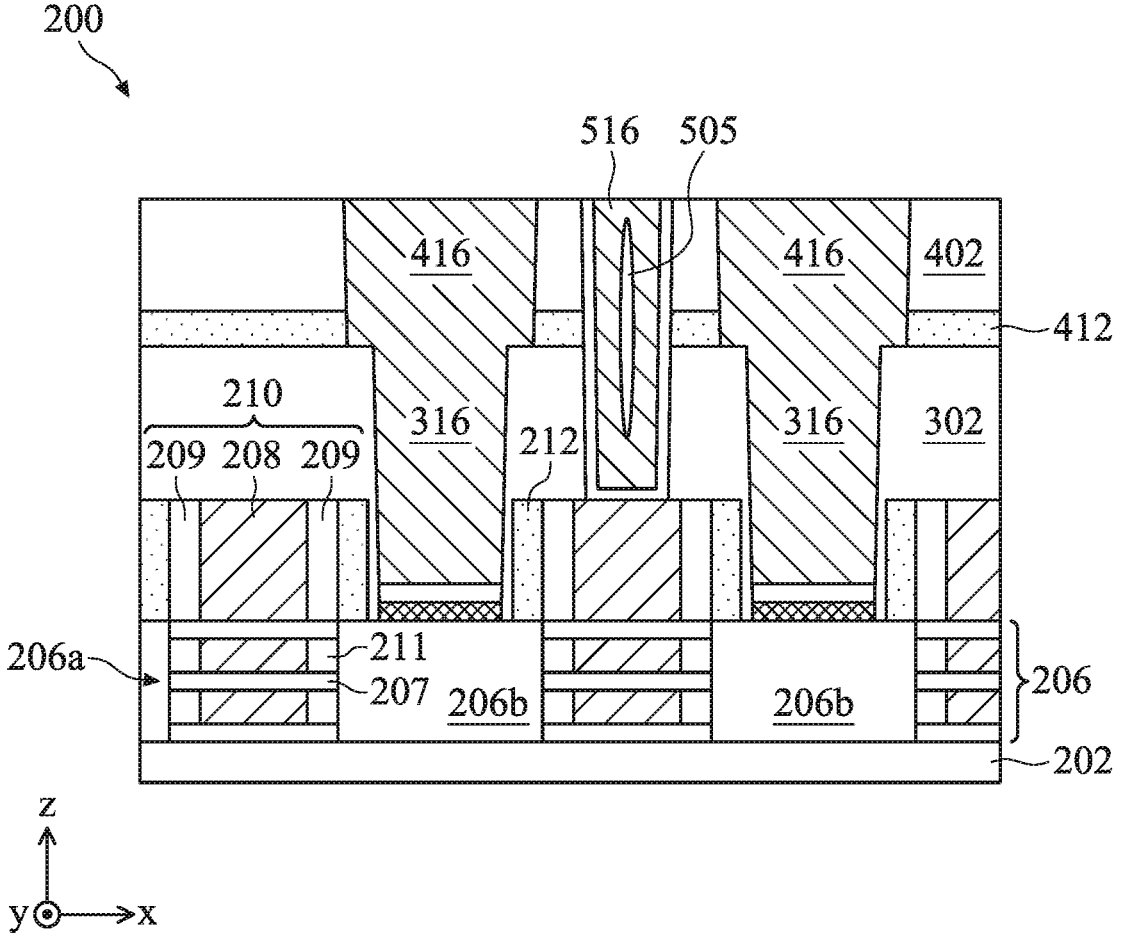
FIG. 21 illustrate a cross-sectional view of a semiconductor device processed in accordance with the method of FIGS. 1A-1B according to another embodiment of the present disclosure.

FIG. 21 illustrate a cross-sectional view of a semiconductor device 200 processed in accordance with the method of FIGS. 1A-1B according to another embodiment of the present disclosure. FIG. 21 is similar to FIG. 20 and the similar features will not be described for the sake of brevity. The difference is that the all-tungsten contact scheme is applied to GAA devices. As shown, the channel regions 206a includes a stack of channel layers 207, and each of the channel layers 207 is wrapped around by the gate structure 210 (specifically the gate stacks 208). Inner spacers 211 may also be disposed in the channel regions 206a between channel layers 207 and between the gate stacks 208 and the S/D regions 206b.

Although not intended to be limiting, the present disclosure offers advantages related to metal contacts and vias such as S/D contacts, S/D vias, and gate vias. One example advantage is that the metal contacts and vias are all made of tungsten for homogenous interface. Another example advantage is that the S/D contacts and S/D vias are formed to be without voids. Another example advantage is that instead of depositing a traditional barrier layer, a tungsten seed layer is used when forming gate vias.

One aspect of the present disclosure pertains to a method of forming a semiconductor device. The method includes receiving a workpiece having gate structures over channel regions on a substrate and source/drain (S/D) features adjacent to the channel regions. The method includes forming tungsten S/D contacts over the S/D features in a first ILD layer by a first selective bottom-up metal growth process. The method includes forming tungsten S/D vias over the tungsten S/D contacts in a second ILD layer by a second selective bottom-up metal growth process. And after forming the tungsten S/D vias, the method includes forming tungsten gate vias over the gate structures in the first and second ILD layer. The forming of the tungsten gate vias includes forming a tungsten seed layer by physical vapor deposition (PVD), and depositing tungsten directly on horizontal and sidewall surfaces of the tungsten seed layer by chemical vapor deposition (CVD).

In an embodiment, the tungsten seed layer is a second tungsten seed layer, and the forming of the tungsten S/D contacts includes forming a first tungsten seed layer by PVD, removing portions of the first tungsten seed layer, and depositing tungsten on horizontal surfaces of the first tungsten seed layer by the first selective bottom-up metal growth process.

In a further embodiment, the tungsten S/D vias are formed directly on horizontal surfaces of the tungsten S/D contacts.

In an embodiment, the tungsten S/D contacts and tungsten S/D vias are formed without voids, and the tungsten gate vias are formed with one or more voids.

In an embodiment, the tungsten S/D vias and tungsten gate vias are formed to penetrate through an etch stop layer that is interposed between the first and second ILD layer.

In an embodiment, wherein before forming the tungsten S/D vias, the method further includes forming a conformal conductive barrier layer over the tungsten S/D contacts, depositing an over-burden metal over the conformal conductive barrier layer, and performing a planarization process that removes the conformal conductive barrier layer and the over-burden metal.

In a further embodiment, the conformal conductive barrier layer is different in material composition from the tungsten S/D contacts.

In a further embodiment, the over-burden metal is tungsten, and the over-burden metal is formed by isotropic chemical vapor deposition.

In a further embodiment, wherein before forming the tungsten gate vias, the method further includes forming a conformal conductive barrier layer over the tungsten S/D vias, depositing an over-burden metal over the conformal conductive barrier layer, and performing a planarization process that removes the conformal conductive barrier layer and the over-burden metal.

Another aspect of the present disclosure pertains to a method of forming a semiconductor device. The method includes receiving a workpiece having gate structures over channel regions on a substrate and source/drain (S/D) features adjacent to the channel regions. The method includes depositing a first interlayer dielectric (ILD) layer over the gate structures and over the S/D features. The method includes forming S/D trenches through the first ILD layer, the S/D trenches exposing top surfaces of the S/D features. The method includes forming silicide features on the S/D features. The method includes forming a first tungsten seed layer by physical vapor deposition (PVD) over the first ILD layer and in the S/D trenches. A bottom portion of the first tungsten seed layer directly lands on the silicide features. The method includes removing top and side portions of the first tungsten seed layer so that only the bottom portions of the first tungsten seed layer remain. The method includes forming tungsten S/D contacts over the bottom portions of the first tungsten seed layer by selective bottom-up metal growth. The method includes depositing a second ILD layer over the S/D contacts and over the first ILD layer. The method includes forming S/D via trenches through the second ILD layer, the S/D via trenches exposing top surfaces of the tungsten S/D contacts. The method includes forming tungsten S/D vias over the tungsten S/D contacts by selective bottom-up metal growth. After forming the tungsten S/D vias, the method includes forming gate via trenches through the first and second ILD layers, the gate via trenches exposing top surfaces of the gate structures. The method includes forming a second tungsten seed layer by PVD over the second ILD layer and in the gate via trenches. And the method includes forming tungsten gate vias over the second tungsten seed layer by chemical vapor deposition (CVD).

In an embodiment, the removing of the top and side portions of the first tungsten seed layer comprises a first removal process and a second removal process, and the first removal process removes the top portions of the first tungsten seed layer and the second removal process removes the side portions of the first tungsten seed layer.

In a further embodiment, first removal process includes depositing a sacrificial layer in the S/D trenches and over the first tungsten seed layer, partially etching the sacrificial layer to expose the top portions of the first tungsten seed layer, and etching the exposed top portions of the first tungsten seed layer.

In a further embodiment, the second removal process includes etching the remaining portions of the sacrificial layer to expose the side portions of the first tungsten seed layer, and etching the exposed side portions of the first tungsten seed layer.

In an embodiment, the forming of the tungsten S/D contacts includes the steps of growing a tungsten metal layer on the first tungsten seed layer to a first height and having a top surface below a top surface of the first ILD layer; forming a conformal conductive barrier layer over the tungsten metal layer and over top and side surfaces of the first ILD layer; forming an over-burden metal over the conformal conductive barrier layer; and performing a planarization process that removes the conformal conductive barrier layer and the over-burden metal, the planarization process planarizes the first ILD layer and the tungsten metal layer to a second height lower than the first height.

In an embodiment, the S/D via trenches are formed wider than the S/D trenches such that the S/D via trenches also expose a top surface of the first ILD layer.

In an embodiment, each of the channel regions includes a stack of channel layers wrapped around by respective gate structures over the channel regions.

Another aspect of the present disclosure pertains to a semiconductor device. The semiconductor device includes a channel region on a substrate and an S/D feature adjacent to the channel region. The semiconductor device includes a gate structure over the channel region, a first interlayer dielectric (ILD) layer over the gate structure, an etch stop layer over the first ILD layer, and a second ILD layer over the etch stop layer. A tungsten S/D contact is disposed over the S/D feature and surrounded by the first ILD layer. A tungsten S/D via lands on the S/D contact and is surrounded by the second ILD layer. And a tungsten gate via lands on the gate structure and is surrounded by the first and the second ILD layers. The tungsten gate via includes one or more air gaps.

In an embodiment, the tungsten S/D contact has a first width less than a second width of the tungsten S/D via, and the tungsten S/D via also lands on a top surface of the first ILD layer.

In an embodiment, the channel region includes a stack of channel layers, and each of the channel layers is wrapped around by the gate structure.

In an embodiment, bottom and sidewall surfaces of the tungsten gate via are lined with a tungsten seed layer, the tungsten seed layer having a greater metal conductivity than the tungsten gate via.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method of forming a semiconductor device, comprising:
   receiving a workpiece having gate structures over channel regions on a substrate and source/drain (S/D) features adjacent to the channel regions;
   forming tungsten S/D contacts over the S/D features in a first ILD layer by a first selective bottom-up metal growth process;
   forming tungsten S/D vias over the tungsten S/D contacts in a second ILD layer by a second selective bottom-up metal growth process; and
   after forming the tungsten S/D vias, forming tungsten gate vias over the gate structures in the first and the second ILD layer,
   wherein forming the tungsten gate vias includes forming a tungsten seed layer by physical vapor deposition (PVD), and depositing tungsten directly on horizontal and sidewall surfaces of the tungsten seed layer by chemical vapor deposition (CVD).

2. The method of claim 1, wherein
   the tungsten seed layer is a second tungsten seed layer, and the forming of the tungsten S/D contacts includes:
   forming a first tungsten seed layer by PVD;
   removing portions of the first tungsten seed layer; and
   depositing tungsten on horizontal surfaces of the first tungsten seed layer by the first selective bottom-up metal growth process.

3. The method of claim 2, wherein the tungsten S/D vias are formed directly on horizontal surfaces of the tungsten S/D contacts.

4. The method of claim 2, wherein before forming the tungsten S/D vias, further comprising:
   forming a conformal conductive barrier layer over the tungsten S/D contacts;
   depositing an over-burden metal over the conformal conductive barrier layer; and
   performing a planarization process that removes the conformal conductive barrier layer and the over-burden metal.

5. The method of claim 4, wherein the conformal conductive barrier layer is different in material composition from the tungsten S/D contacts.

6. The method of claim 4, wherein the over-burden metal is tungsten, and the over-burden metal is formed by isotropic chemical vapor deposition.

7. The method of claim 2, wherein before forming the tungsten gate vias, further comprising:
   forming a conformal conductive barrier layer over the tungsten S/D vias;
   depositing an over-burden metal over the conformal conductive barrier layer; and
   performing a planarization process that removes the conformal conductive barrier layer and the over-burden metal.

8. Method of claim 1, wherein the tungsten S/D contacts and tungsten S/D vias are formed without voids, and the tungsten gate vias are formed with one or more voids.

9. The method of claim 1, wherein the tungsten S/D vias and tungsten gate vias are formed to penetrate through an etch stop layer that is interposed between the first and second ILD layer.

10. A method of forming a semiconductor device, comprising:
   receiving a workpiece having gate structures over channel regions on a substrate and source/drain (S/D) features adjacent to the channel regions;
   depositing a first interlayer dielectric (ILD) layer over the gate structures and over the S/D features;
   forming S/D trenches through the first ILD layer, the S/D trenches exposing top surfaces of the S/D features;
   forming silicide features on the S/D features;
   forming a first tungsten seed layer by physical vapor deposition (PVD) over the first ILD layer and in the S/D trenches, wherein a bottom portion of the first tungsten seed layer directly lands on the silicide features;
   removing top and side portions of the first tungsten seed layer so that only the bottom portions of the first tungsten seed layer remain;
   forming tungsten S/D contacts over the bottom portions of the first tungsten seed layer by selective bottom-up metal growth;
   depositing a second ILD layer over the S/D contacts and over the first ILD layer;
   forming S/D via trenches through the second ILD layer, the S/D via trenches exposing top surfaces of the tungsten S/D contacts;
   forming tungsten S/D vias over the tungsten S/D contacts by selective bottom-up metal growth;
   after forming the tungsten S/D vias, forming gate via trenches through the first and second ILD layers, the gate via trenches exposing top surfaces of the gate structures;
   forming a second tungsten seed layer by PVD over the second ILD layer and in the gate via trenches; and
   forming tungsten gate vias over the second tungsten seed layer by chemical vapor deposition (CVD).

11. The method of claim 10,
   wherein the removing of the top and side portions of the first tungsten seed layer comprises a first removal process and a second removal process,
   wherein the first removal process removes the top portions of the first tungsten seed layer and the second removal process removes the side portions of the first tungsten seed layer.

12. The method of claim 11, wherein the first removal process comprises:
   depositing a sacrificial layer in the S/D trenches and over the first tungsten seed layer;
   partially etching the sacrificial layer to expose the top portions of the first tungsten seed layer; and
   etching the exposed top portions of the first tungsten seed layer.

13. The method of claim 12, wherein the second removal process comprises:
   etching the remaining portions of the sacrificial layer to expose the side portions of the first tungsten seed layer; and
   etching the exposed side portions of the first tungsten seed layer.

14. The method of claim 10, wherein the forming of the tungsten S/D contacts comprises:

growing a tungsten metal layer on the first tungsten seed layer to a first height and having a top surface below a top surface of the first ILD layer;

forming a conformal conductive barrier layer over the tungsten metal layer and over top and side surfaces of the first ILD layer;

forming an over-burden metal over the conformal conductive barrier layer; and performing a planarization process that removes the conformal conductive barrier layer and the over-burden metal, the planarization process planarizes the first ILD layer and the tungsten metal layer to a second height lower than the first height.

15. The method of claim 10, wherein the S/D via trenches are formed wider than the S/D trenches such that the S/D via trenches also expose a top surface of the first ILD layer.

16. The method of claim 10, wherein each of the channel regions includes a stack of channel layers wrapped around by respective gate structures over the channel regions.

17. A method of forming a semiconductor device, comprising:

forming a channel region on a substrate and an S/D feature adjacent to the channel region;

forming a gate structure over the channel region;

forming a first interlayer dielectric (ILD) layer over the gate structure;

forming an etch stop layer over the first ILD layer;

forming a second ILD layer over the etch stop layer;

forming a tungsten S/D contact over the S/D feature and surrounded by the first ILD layer;

forming a tungsten S/D via landing on the S/D contact and surrounded by the second ILD layer; and forming a tungsten gate via landing on the gate structure and surrounded by the first and the second ILD layers, wherein the tungsten gate via includes one or more air gaps.

18. The method of claim 17, wherein the tungsten S/D contact has a first width less than a second width of the tungsten S/D via; and the tungsten S/D via also lands on a top surface of the first ILD layer.

19. The method of claim 17, wherein the channel region includes a stack of channel layers; and each of the channel layers is wrapped around by the gate structure.

20. The method of claim 17, wherein bottom and sidewall surfaces of the tungsten gate via are lined with a tungsten seed layer, the tungsten seed layer having a greater metal conductivity than the tungsten gate via.

* * * * *